US010998175B2

(12) United States Patent
Ozdemir et al.

(10) Patent No.: US 10,998,175 B2
(45) Date of Patent: May 4, 2021

(54) DEVICE FOR CHARACTERIZING PARTICLES AND USES THEREOF

(71) Applicant: Academia Sinica, Taipei (TW)

(72) Inventors: Abdil Ozdemir, Sakarya (TR); Jung-Lee Lin, Taipei (TW); Chung-Hsuan Chen, Taipei (TW)

(73) Assignee: ACADEMIA SINICA, Taipei (TW)

( * ) Notice: Subject to any disclaimer, the term of this patent is extended or adjusted under 35 U.S.C. 154(b) by 0 days.

(21) Appl. No.: 16/686,203

(22) Filed: Nov. 17, 2019

(65) Prior Publication Data

US 2020/0161110 A1 May 21, 2020

Related U.S. Application Data

(60) Provisional application No. 62/768,115, filed on Nov. 16, 2018.

(51) Int. Cl.
*H01J 49/00* (2006.01)
*H01J 49/16* (2006.01)
*H01J 49/06* (2006.01)

(52) U.S. Cl.
CPC ........ *H01J 49/0036* (2013.01); *H01J 49/063* (2013.01); *H01J 49/165* (2013.01)

(58) Field of Classification Search
CPC ..... H01J 49/0036; H01J 49/063; H01J 49/165
See application file for complete search history.

(56) References Cited

U.S. PATENT DOCUMENTS

2013/0020482 A1* 1/2013 Enke ...................... H01J 49/40 250/282

* cited by examiner

*Primary Examiner* — Nicole M Ippolito
*Assistant Examiner* — Hanway Chang

(57) ABSTRACT

Disclosed herein is a device for characterizing a biological sample or an airborne sample. According to embodiments of the present disclosure, the device comprises an electrospray source, a mass analyzer, a charge detector, and optionally, an ion guide. The present device is useful in analyzing the particle population in the biological or airborne sample based on the mass to charge (m/z) ratio and the charge (z) of each particle. Also disclosed herein are the methods of making a diagnosis of cancer by use of the present device, and methods of determining the mass distribution of particles in an airborne sample.

21 Claims, 15 Drawing Sheets

DEVICE FOR CHARACTERIZING PARTICLES AND USES THEREOF

CROSS-REFERENCE TO RELATED APPLICATIONS

This application relates to and claims the benefit of U.S. Provisional Application No. 62/768,115, filed Nov. 16, 2018; the content of the application is incorporated herein by reference in its entirety.

BACKGROUND OF THE INVENTION

1. Field of the Invention

The present disclosure in general relates to the field of particle characterization. More particularly, the present disclosure relates to a device for characterizing particles in a sample, and uses of the device in diagnosing cancers and/or detecting $PM_{2.5}$ or $PM_{10}$ particles.

2. Description of Related Art

Recent discoveries and research have shown that nano- and micro-particles play important roles in our daily lives. Particles with a size of about 2.5 microns have become a major environmental concern worldwide. Analysis of micro-bioparticles is important for monitoring human health. Although there are different high-mass measurement methods, such as flow cytometry, gravimetric determination, cantilever transducers, quartz crystal microbalances, and charge-reduced electrospray size spectrometry, their precision is limited. Moreover, they often require complex sample preparation. Recently, there has been an increasing interest in using a mass spectrometer (MS) to measure the masses of microparticles, which include polymeric particles, human cells, bacteria and viruses. CyTOF has also been used for measurements of biomarkers on each cell, but it cannot be used to measure the cell mass.

Mass measurements of particles face some challenges, such as ionization of particles, sending particles inside the MS and their detection. The first particle ionization study was pursued inside an MS. Wuerker et al. used an electric powder injector that was placed right next to the ion trap. Another approach is called laser-induced acoustic desorption (LIAD). It desorbs the particles inside the ion trap MS. For LIAD, the particles are placed on a Si wafer and inserted inside MS chamber with a probe. A laser is fired onto the backside of the Si wafer. LIAD allows the ionization of nano- and micro-particles, viruses and cells without using a matrix. Visible MALDI cell mass spectrometry has a visible light source and matrix. Open-system MS, such as the electrospray (ESI) MS, provides continuous sampling and faster data collection. Xiong et al. developed a semi-open ionization system and aerodynamic desorption (AD) for microsized particle sampling and ionization. One challenge in particle MS is the physical orientation of MS. Because all particles are under gravitational force, the RF trapping power and gravitational force compete with each other. If the mass analyzer is parallel to the gravitation force, heavy particles can fall before reaching the ion trap. The other challenge is particle detection. Different types of detectors have been developed. The charge of a single particle can be measured directly by a charge detector. Since the speed of a micro-particle (below 20 m/s) is slower than that of a small molecule, the charge collection time is in milliseconds, whereas Faraday disks begin to sense the particle 1 cm away from the disk. Thus, we need a charge detector with a long discharge time constant.

A pioneering ESI study of megadalton proteins was performed by Robinson et al., who used a conventional ESI time-of-flight (TOF) MS. Their study was in the nanometer region. ESI MS studies of compounds with large molecular weight have been reported by different groups. A pioneering study about large bioparticles has been conducted by Fuerstenau et al. They obtained the ESI spectra of intact viruses (40.5 MDa) via a charge-induction tube.

ESI QIT MS (electrospray ionization-quadrupole ion trap mass spectrometry) for cell and/or micro-particle measurements has higher analysis speed compared with that of LIAD MS. In addition, solution samples can be directly analyzed with this approach but not for LIAD. For LIAD, cells must be dried on a silicon wafer surface, and the sample plate is delivered through a load-lock vacuum system. After a few laser shots, a fresh sample plate is loaded after the initial sample has been consumed. These experiments require a lengthy analysis time and large sample amounts. The major advantage of ESI QIT MS is continuous feeding without further sample preparation. Although cell mass can possibly be estimated by microscopy based on the volume and density, some cells are with irregular shapes so that the volume is very difficult to be accurately measured with a microscope. Red blood cell (RBC) is one example.

In view of the foregoing, there exists in the related art a need for a novel device for rapid mass analysis of microsized particles (e.g., cells).

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

As embodied and broadly described herein, one aspect of the disclosure is directed to a device useful in characterizing a sample, for example, a biological sample or an airborne sample. The present device comprises, (a) an electrospray source configured to ionize the particles (e.g., cells) in the sample;

(b) a mass analyzer configured to determine the mass to charge (m/z) ratio of each of the ionized particles; and (c) a charge detector configured to determine the charge (z) of each of the ionized particles.

According to embodiments of the present disclosure, the particles are microsized particles, for example, the particle having a diameter less than 100 micrometers (μm), less than 90 μm, less than 80 μm, less than 70 μm, less than 60 μm. less than 50 μm, less than 40 μm, less than 30 μm, less than 20 μm, less than 10, less than 5 μm, or less than 2.5 μm.

According to embodiments of the present disclosure, the mass analyzer comprises an ion trap that may be a quadrupole ion trap (QIT) or a linear ion trap (LIT). According to some embodiments, the ion trap is a quadrupole ion trap, which comprises a central electrode having a first central aperture, a pair of insulators respectively having a second and a third central apertures; and a pair of end caps respectively having a fourth and a fifth apertures. In structure, the pair of insulators is respectively disposed above and below the central electrode, and the pair of end caps are respectively disposed above and below the pair of insulators. The first, second, third, fourth and fifth apertures are coaxially aligned so that the central electrode, the pair of insulators and the pair of end caps form a partially enclosed cavity, which has a radius of about 1-100 mm, and a length of about 1-100 mm.

According to the preferred example of the present disclosure, the radius of the partially enclosed cavity is about 5 mm, and the length of the partially enclosed cavity is about 14-15 mm.

Optionally, the present device may further comprise a first and/or a second laser source that are respectively coupled to the mass analyzer. In one embodiment, the present device comprises a first laser source. In another embodiment, the present device comprises a second laser source. In still another embodiment, the present device comprises a first and a second laser source. In further another embodiment, the present derive does not comprise any laser source. According to some embodiments of the present disclosure, the first and second laser sources respectively emit a first laser beam having a first wavelength, and a second laser beam having a second wavelength, in which the first and second wavelengths are different. Preferably, the first wavelength is about 525-540 nm, and the second wavelength is about 625-640 nm. In one working example, the first wavelength is about 532 nm, and the second wavelength is about 632 nm.

According to optional embodiments, the central electrode and the pair of end caps is produced by a doped semiconductor material; and the insulator is made of at least one polymer selected from the group consisting of, polypropylene, polyester, polytetrafluoroethylene, polyethylene, polyurethane, polyacrylate, nylon, propyl adiene monomer, polystyrene, butyl methacrylate, methyl methacrylate, and a combination thereof. In one preferred example, the insulator is made of polytetrafluoroethylene.

Optionally, the present device may further comprise an ion guide, which is configured to guide the ionized particles from the electrospray source to the mass analyzer. According to the some embodiments, the ion guide is a quadrupole ion guide, and the length of the electrodes of the quadrupole ion guide is about 1-100 cm; preferably, about 12 cm.

Still optionally, the present device may further comprise a filter, which is configured to guide the ionized particles from the electrospray source to the ion guide. The filter has an orifice of about 0.05 to 2 mm; preferably, the orifice of the filter is about 0.5 mm.

According to embodiments of the present disclosure, the present device does not comprise an advanced pump (i.e., a pump pulling pressure down to $10^{-6}$ Torr or lower; for example, a turbo pump, a diffusion pump, anion pump, or a cryogenic (cryo) pump), and is useful in analyzing dry or solution phase samples. In these embodiments, the present device may be used to analyze cells as large as 15 μm.

Another aspect of the present disclosure pertains to a method of determining whether a subject has or is at risk of developing a cancer. The method comprises, (a) obtaining a biological sample from the subject, wherein the biological sample comprises a plurality of cells;

(b) determining the mass to charge (m/z) ratio and the charge (z) of each of the cells in the biological sample by use of the present device;

(c) calculating the mass of each of the cells in the biological sample based on the result of the step (b); and (d) assessing whether the subject has or is at risk of developing the cancer based on the calculated mass in step (c), wherein when the mass distribution of the cells in the biological sample is different from that of a control sample, then the subject has or is at risk of developing the cancer.

Depending on desired purposes, the control sample may be derived from a healthy subject or be a synthetic polystyrene particle.

According to some embodiments of the present disclosure, the biological sample is suspended in 70% ethanol.

According to certain embodiments, the present method further comprises fixing the biological sample by a fixation buffer (e.g., formaldehyde) prior to the step (b).

The cancer may be any of gastric cancer, lung cancer, bladder cancer, breast cancer, pancreatic cancer, renal cancer, colorectal cancer, cervical cancer, ovarian cancer, brain tumor, prostate cancer, hepatocellular carcinoma, melanoma, esophageal carcinoma, multiple myeloma, or head and neck squamous cell carcinoma.

The subject is a mammal; preferably, a human.

The third aspect of the present disclosure is directed to a method of determining the mass distribution of particles in an airborne sample. The method comprises, (a) determining the mass to charge (m/z) ratio and the charge (z) of each of the particles by use of the present device;

(b) calculating the mass of each of the particles based on the result of the step (a); and (c) determining the mass distribution of the particles in the airborne sample based on the calculated mass in step (b).

In general, the particles are microsized particles; that is, each of the particles has a diameter less than 1,000 μm. According to some embodiments of the present disclosure, the particles have an average diameter less than 10 micrometers, e.g., $PM_{10}$ particles. According to alternative embodiments of the present disclosure, the particles have an average diameter less than 2.5 micrometers, e.g., $PM_{2.5}$ particles.

Many of the attendant features and advantages of the present disclosure will becomes better understood with reference to the following detailed description considered in connection with the accompanying drawings.

BRIEF DESCRIPTION OF THE DRAWINGS

The present description will be better understood from the following detailed description read in light of the accompanying drawings, where:

FIG. 7A: the mass distribution of 7-μm PS particles sprayed in a 70% ethanol solution. FIG. 7B: the particle mass distribution of 70% ethanol solution. FIG. 7C: a photograph depicting the mixture of the 7-μm PS particles and fixed RBC in a 70% ethanol solution. FIG. 7D: the mass distribution of RBC.

FIG. 8A: the size distribution of MCF-7 cancer cells, which had an average diameter of 14.1 μm. FIGS. 8B-8D: the mass distributions of MCF-7 cancer cells respectively having an average diameter of 14.1 μm (FIG. 8B), 13.1 μm (FIG. 8C) and 11.1 μm (FIG. 8D).

Figure 1A:
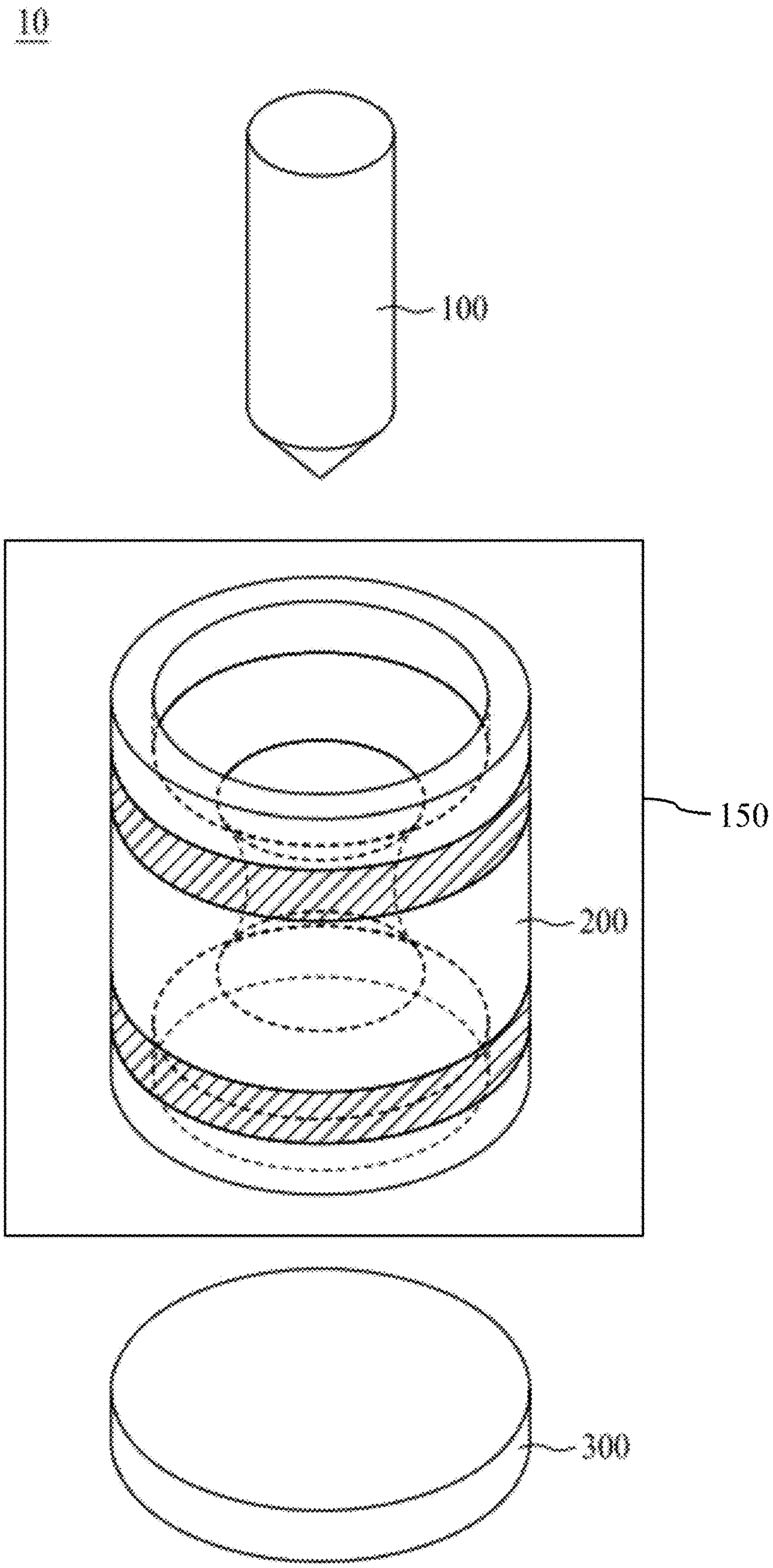
FIGS. 1A-1B are schematic diagrams that respectively depict the device 10 and the ion trap 200 according to one embodiment of the present disclosure.

In accordance with common practice, the various described features/elements are not drawn to scale but instead are drawn to best illustrate specific features/elements relevant to the present invention. Also, like reference numerals and designations in the various drawings are used to indicate like elements/parts.

DETAILED DESCRIPTION OF THE INVENTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

I. Definition

For convenience, certain terms employed in the specification, examples and appended claims are collected here. Unless otherwise defined herein, scientific and technical terminologies employed in the present disclosure shall have the meanings that are commonly understood and used by one of ordinary skill in the art. Also, unless otherwise required by context, it will be understood that singular terms shall include plural forms of the same and plural terms shall include the singular. Specifically, as used herein and in the claims, the singular forms "a" and "an" include the plural reference unless the context clearly indicates otherwise. Also, as used herein and in the claims, the terms "at least one" and "one or more" have the same meaning and include one, two, three, or more.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about". Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques.

The term "mass analyzer" as used herein refers to a component or subsystem that is used for determination of the mass to charge ratio of analytic particles (e.g., the ionized particles) of the present disclosure.

As used herein, the term "ion trap" refers to an electrical and/or magnetic field that captures ions in a region of a vacuum system. Ion trap is used in the present device to trap ions, and eject ions axially and/or radially to the detector. Exemplary ion traps include, but are not limited to, quadrupole ion trap, linear ion trap, Fourier transform ion cyclotron resonance ion trap, cylindrical ion trap, orbitrap ion trap, and multipole ion trap.

The term "subject" refers to a mammal including the human species that may be assessed by the device and/or methods of the present invention. The term "subject" is intended to refer to both the male and female gender unless one gender is specifically indicated.

The term "healthy subject" refers to a subject that does not have a disease (e.g., cancer). For example, a healthy subject has not been diagnosed as having a disease and is not presenting with two or more (e.g., two, three, four or five) symptoms associated with the disease.

II. Description of the Invention

The present invention is directed to a device for analyzing microsized particles (e.g., cells). Specifically, the present device is useful in characterizing microsized particles via measuring the mass to charge (m/z) ratio and the charge (z) thereof. Based on the m/z ratio and z value measured, persons skilled in the art are capable of calculating the mass of each microsized particle, and accordingly, determining the population of the microsized particles. The present device can be used to evaluating whether or not a biological sample comprises a heterogeneous population of cells (e.g., normal cells and cancer cells). Alternatively, the present device also provides a means to analyze the level of specified particles (e.g., the particle having a diameter less than 2.5 or 10 μm) in an airborne sample.

The first aspect is thus directed to a device for characterizing a sample, such as a biological sample or an airborne sample. Reference is now made to FIG. 1A, in which the device 10 comprises an electrospray source 100, a mass analyzer 150 and a charge detector 300. The electrospray source 100 is configured to ionize the particles in the sample; the mass analyzer 150 is configured to determine the mass to charge (m/z) ratio of each of the ionized particles; and the charged detector 300 is configured to determine the charge (z) of each of the ionized particles.

Figure 1B:
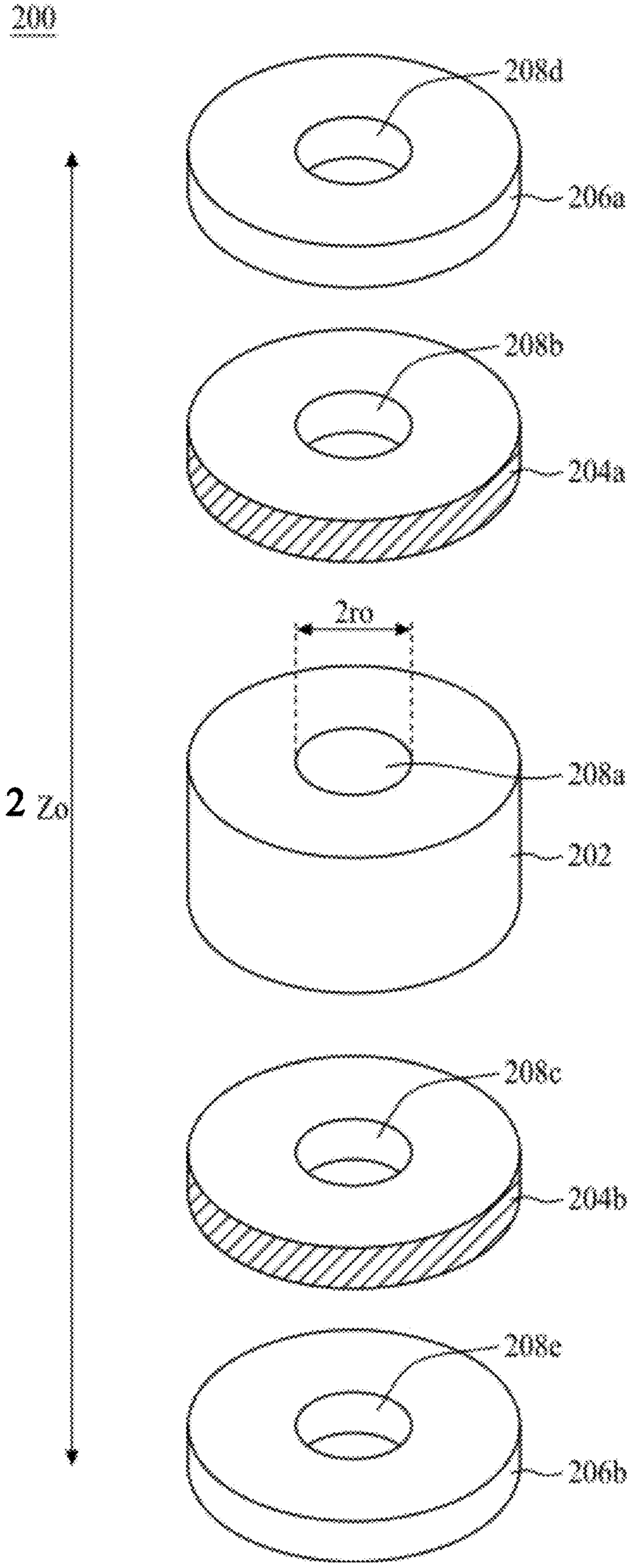

As depicted in FIG. 1A, the mass analyzer 150 comprises an ion trap 200. According to some embodiments of the present disclosure, the ion trap 200 may be a quadrupole ion trap as depicted in FIG. 1B, in which the in trap 200 comprises, a central electrode 202, which comprises a first central aperture 208*a;* a pair of insulators (204*a*, 204*b*), in which the insulator 204*a* comprises a second central aperture 208*b* and is disposed above the central electrode 202, while the insulator 204*b* comprises a third central aperture 208*c* and is disposed below the central electrode 202; and a pair of end caps (206*a*, 206*b*), in which the end cap 206*a* comprises a fourth aperture 208*d* and is disposed above the insulator 204*a*, while the end cap 206*b* comprises a fifth aperture 208*e* and is disposed below the insulator 204*b*.

In structure, the first, second, third, fourth and fifth apertures (208*a*, 208*b*, 208*c*, 208*d*, 208*e*) are coaxially aligned so that the central electrode 202, the pair of insulators (204*a*, 204*b*) and the pair of end caps (206*a*, 206*b*) form a partially enclosed cavity. According to some embodiments of the present disclosure, the cavity has a length $2z_0$ of about 1-100 mm, and a radius $r_0$ of about 1-100 mm. Preferably, the length $2z_0$ of the cavity is about 10-50 mm, and the radius $r_0$ of the cavity is about 1-20 mm. In one working example, the length $2z_0$ is about 14-15 mm, and the radius $r_0$ is about 5 mm.

Each of the central electrode 202 and the end caps (206*a*, 206*b*) is produced by a doped semiconductor material, which comprises at least one semiconductor matrix and at least one doping material. Non-limiting examples of semiconductor include, silicon, germanium, silicon-germanium, compounds of groups I-Vll, II-Vl and III-V and the combination thereof. The doping materials may be selected from the group consisting of Group IA, IIA, IIIA, IIB, IIIB or VA of the periodic table. Regarding the insulators (204*a*, 204*b*), they are preferably made of at least one polymer selected from the group consisting of polypropylene, polyester, polytetrafluoroethylene, polyethylene, polyurethane, polyacrylate, nylon, propyl adiene monomer, polystyrene, butyl methacrylate, methyl methacrylate, and a combination thereof. According to one working example, the insulators (204*a*, 204*b*) are made of polytetrafluoroethylene.

Alternatively, the ion trap of the present device may be a linear ion trap or other devices useful in trapping ions in the vacuum system thereof, and sequentially ejecting the ions to the detector.

According to some embodiments, the mass analyzer for determining the m/z ratio of the ionized particles is based on the interaction of each ionized particle with the electric and/or magnetic field. Specifically, the mass analyzer subjects the ionized particles to an electric field oscillating at a radio frequency (RF). The frequency of oscillation may be scanned to eject the ionized particles from the ion trap according to their m/z ratio.

Figure 2:
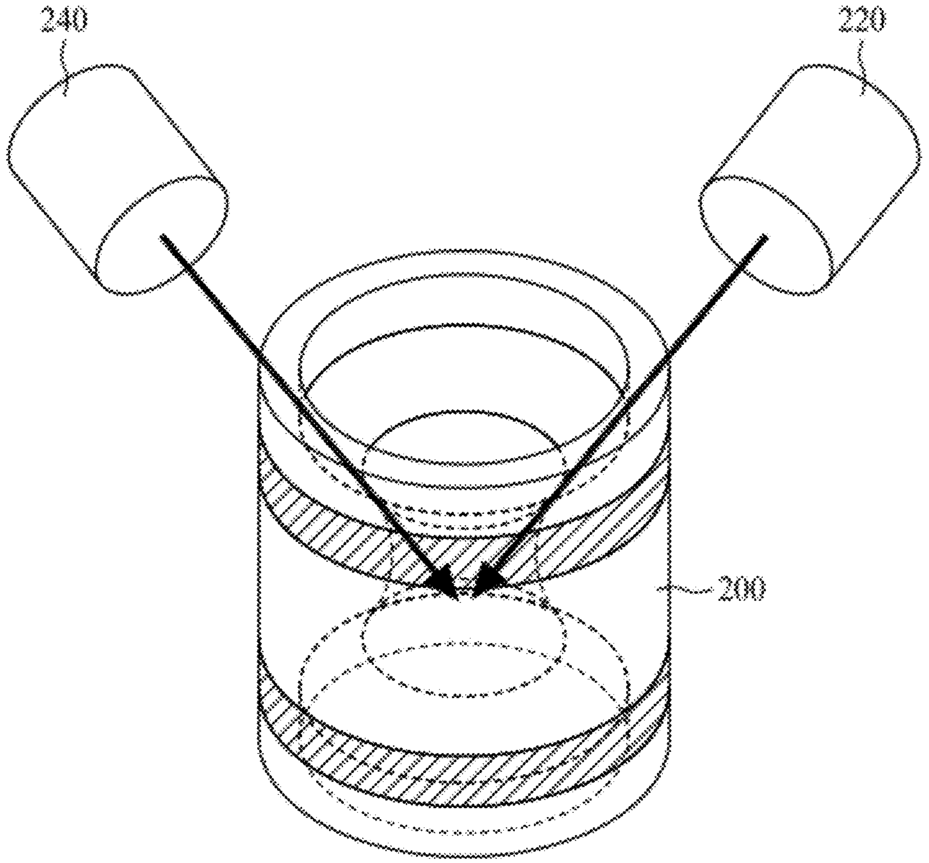
FIG. 2 is a schematic diagram that depicts two laser sources 220, 240 are respectively coupled to the ion trap 200 according to one embodiment of the present disclosure.

Optionally, the present device may further comprise two laser sources. Reference is now made to FIG. 2, in which two laser sources (220, 240) are coupled to the ion trap 200. According to certain embodiments of the present disclosure, the first laser source 220 emits a Nd:YAG laser beam having a wavelength of 532 nm; and the second laser source 240 emits a He—Ne laser beam having a wavelength of 632 nm. In these embodiments, the Nd:YAG laser beam induces the desorption of the microsized particles (e.g., cells), a process to vaporize the microsized particles into the gas phase. The desorbed microsized particles are then illuminated by the He—Ne laser beam so that these particles can be traced by a suitable imaging device, for example, a charge coupled device (CCD).

Figure 3:
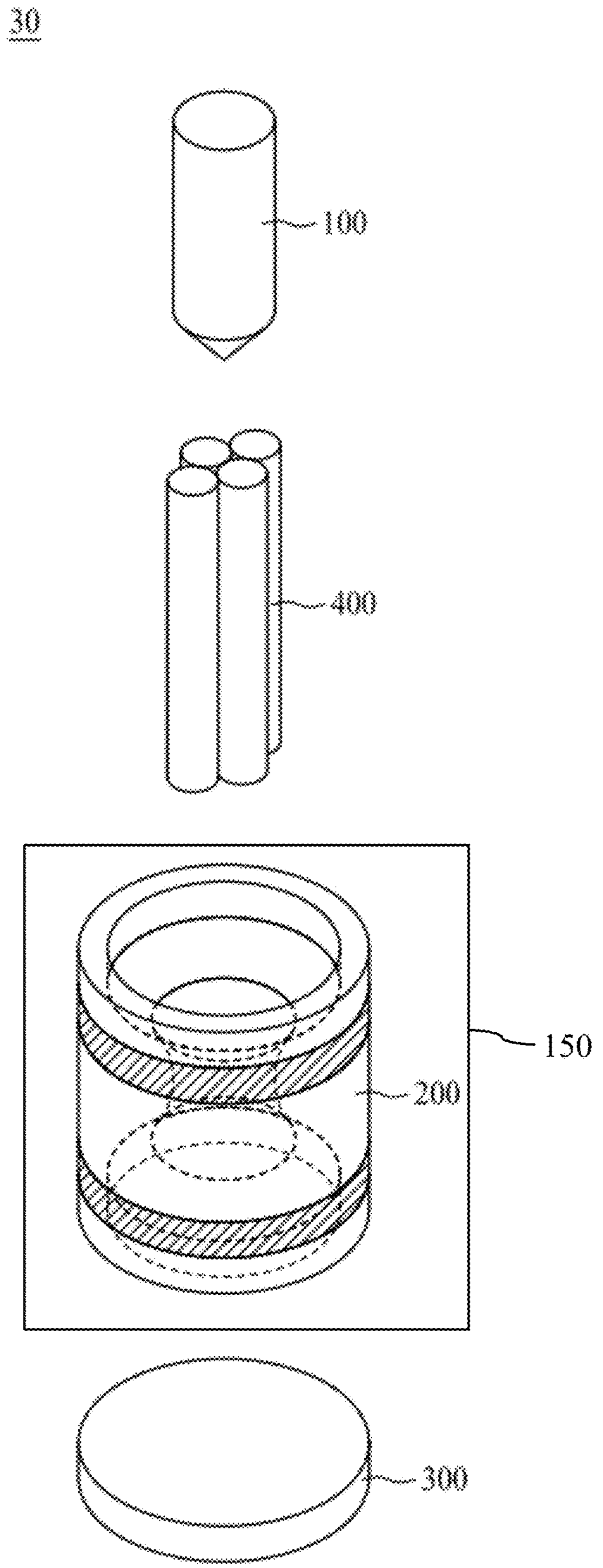
FIG. 3 is a schematic diagram that depicts the device 30 according to another embodiment of the present disclosure.

FIG. 3 provides an alternative embodiment of the present disclosure. In addition to the electrospray source 100, the mass analyzer 150 and the charge detector 300, the device 30 further comprises an ion guide 400, which is configured to guide the ionized particles from the electrospray source 100 to the mass analyzer 150. Depending on desired purposes, the ion guide 400 may be a quadrupole, a hexapole or an octapole. According to certain embodiments of the present disclosure, the ion guide 400 is a quadrupole, in which the length of the electrodes of the quadrupole ion guide is about 1-100 cm. According to one specific embodiment, the length of the electrode of the quadrupole ion guide is about 12 cm.

Figure 4:
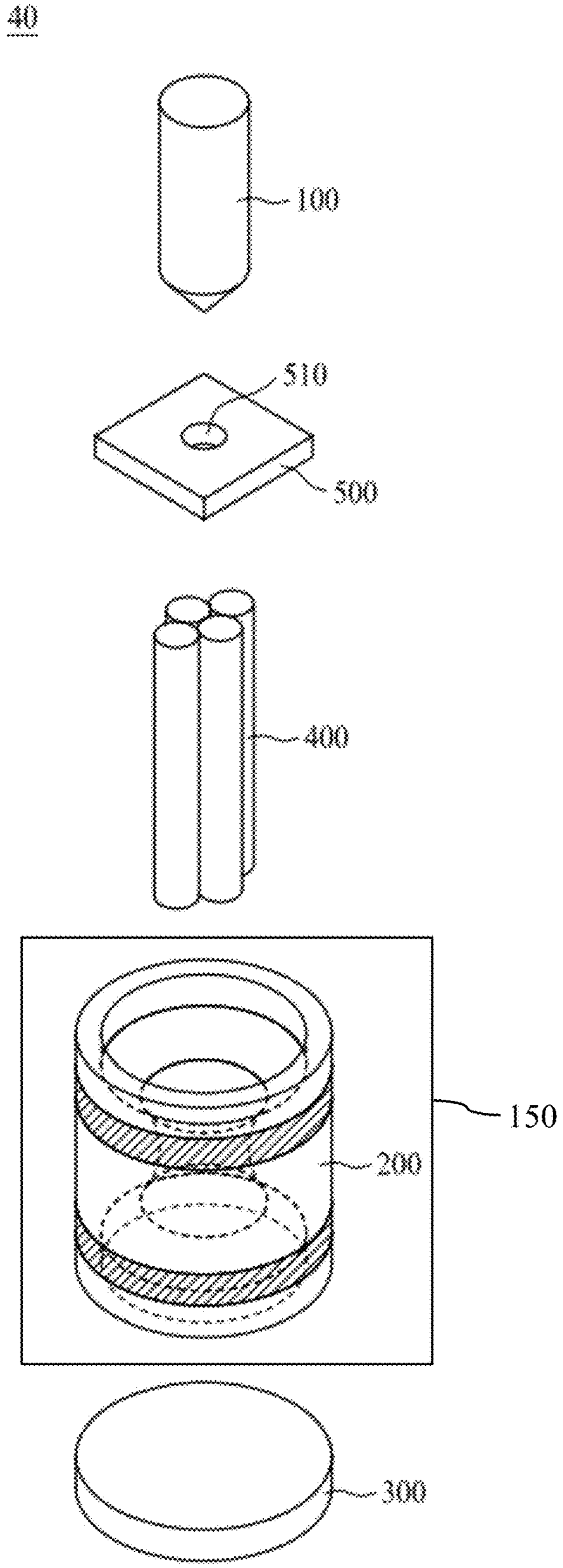
FIG. 4 is a schematic diagram that depicts the device 40 according to still another embodiment of the present disclosure.

Additionally or alternatively, the present device may further comprise a filter. Reference is now made to FIG. 4, in which the device 40 has a configuration similar to the device 30 of FIG. 3, except a filter 500 is further included. In FIG. 4, the filter 500 is configured to guide the ionized particles from the electrospray source 100 to the ion guide 400, and has an orifice 510. According to some embodiments, the diameter of the orifice 510 is about 0.05 to 2 mm. In one working example, the diameter of the orifice 510 is about 0.5 mm.

The second aspect of the present disclosure pertains to a method of determining whether a subject has or is at risk of developing a cancer by use of the present device in accordance with any embodiments mention above. The method comprises the steps of, (a) obtaining a biological sample from the subject, wherein the biological sample comprises a plurality of cells;

(b) determining the mass to charge (m/z) ratio and the charge (z) of each of the cells in the biological sample by use of the present device;

(c) calculating the mass of each of the cells in the biological sample based on the result of the step (b); and (d) assessing whether the subject has or is at risk of developing the cancer based on the calculated mass in step (c), wherein when the mass distribution of the cells in the biological sample is different from that of a control sample, then the subject has or is at risk of developing the cancer.

Basically, the subject suitable for assessment by the present method is a mammal, for example, a human, a mouse, a rat, a hamster, a guinea pig, a rabbit, a dog, a cat, a cow, a goat, a sheep, a monkey, and a horse. Preferably, the subject is a human.

In the step (a), the biological sample is isolated from the subject in need thereof, for example, the subject having or suspected of having a cancer, or having a risk of developing a cancer. The biological sample may be a blood sample, a pleural fluid sample, a peritoneal fluid sample, a central spinal fluid sample, a urine sample, a saliva sample or a biopsy sample of the subject.

Then, in the step (b), the m/z ratio and the z value of each of the cells comprised in the biological sample are determined by the present device so that the mass of each of the cells can be calculated in the step (c).

Optionally, the biological sample may be suspended in a solution prior to the step (b). According to the preferred example, the biological sample is suspended in a low-polarity organic solvent. In one working example, the biological sample is suspended in 70% ethanol.

Still optionally, the biological sample may be fixed by a fixation buffer prior to the step (b), for example, formaldehyde.

Next, the presence or absence of cancer cells in the biological sample is assessed in the step (d). It is known that the shape, size, mass and/or protein composition are often altered in cancer cells as compared to normal cells. Thus, persons skilled in the art are capable of distinguishing the cell population in the biological sample based on the mass distribution thereof. According to embodiments of the present disclosure, when the mass distribution of the cells in the biological sample is different (either the amplitude or the phase fluctuation) from that of a control sample, then the subject has or is at risk of developing the cancer. Depending on desired effect, the control sample may be derived from a healthy subject or be a synthetic polystyrene particle.

Examples of cancer that may be verified from the mass distribution of cells in a biological sample include, but are not limited to, gastric cancer, lung cancer, bladder cancer, breast cancer, pancreatic cancer, renal cancer, colorectal cancer, cervical cancer, ovarian cancer, brain tumor, prostate cancer, hepatocellular carcinoma, melanoma, esophageal carcinoma, multiple myeloma, or head and neck squamous cell carcinoma. According to some embodiments of the present disclosure, the cancer is brain tumor.

A skilled artisan or a clinical practitioner may make a prompt diagnosis and treatment to the subject in need thereof in accordance with the prognostic and/or diagnostic result determined by the present method, in which the subject having or being at risk of developing the cancer is subjected to an anti-cancer treatment (e.g., a prophylactic treatment or a therapeutic treatment) or be placed in an intensive follow-up regimen.

Accordingly, another aspect of the present disclosure pertains to a method of diagnosing and treating a cancer in a subject. The method comprises determining whether or not a subject has the cancer by the steps (a) to (d) of the aforementioned method followed by the step (e) of administering to the subject having or being at a risk of developing the cancer an effective amount of an anti-cancer treatment. In general, the anti-cancer treatment can be a preventive treatment (e.g., administration of anti-oxidant agents), a therapeutic treatment (e.g., chemotherapy, surgical resection, radiation therapy and immunotherapy) or the combination thereof.

Non-limiting examples of anti-oxidant agents include amine (e.g., N,N-diethylhydroxylamine, and amino-guanidine), arginine pilolate, ascorbic acid and its salts, ascorbyl ester of fatty acid, bioflavonoid, butylated hydroxy benzoic acid and its salt, dihydroxy fumaric acid and its salts, gallic acid and its alkyl esters (e.g., propyl gallate, and uric acid), glycine pidolate, 6-hydroxy-2,5,7,8-tetramethylchroman-2-carboxylic acid, lipoic acid, lysine, melanin, methionine, nordihydroguaiaretic acid, proline, silymarin, sorbic acid and its salts, sulfhydryl compounds (e.g., glutathione), superoxide dismutase, catalase, tea extract, grape skin/seed extract, rosemary extract, tocopherol acetate, tocopherol, tocopherol sorbate, and a combination thereof.

Exemplary anti-tumor agents include, but are not limited to, doxorubicin, adriamycin, bleomycin, actinomycin, dactinomycin, mutamycin, daunorubicin, epirubicin, idarubicin, mitoxantrone, mitomycin, epipodophyllotoxins, etoposide, teniposide, antimicrotubule agent, vinblastine, vincristine, vindesine, vinorelbine, taxane, paclitaxel (taxol), docetaxel (taxotere), nitrogen mustard, chlorambucil, cyclophosphamide, estramustine, ifosfamide, mechlorethamine, melphalan, aziridines, thiotepa, alkyl sulfonate, busulfan, nitrosoureas, carmustine, lomustine, streptozocin, platinum complex, carboplatin, cisplatin, alkylator, altretamine, dacarbazine, procarbazine, temozolamide, methotrexate, fludarabine, mercaptopurine, thiogaunine, cladribine, pentostatin, capecitabine, cytarabine, floxuridine, fluorouracil, gemcitabine, hydroxyurea, camptothecin, irinotecan, busufane, epothilone, azathioprine, halofuginone, sirolimus, everolimus, mytomycin, and topotecan.

Depending on desired purposes, the radiation therapy may be external beam radiation therapy, or internal radiation therapy (e.g., brachytherapy).

Regarding the immunotherapy, it may be any agent eliciting the immune response of the subject against cancer cells, for example, an immunomodulatory agent. Exemplary immunomodulatory agents include, but are not limited to, thalidomide, lenolidomide, pomalidomide, anti-programmed cell death-1 (PD-1) antibody, anti-programmed cell death-ligand 1 (PD-L1) antibody, anti-cytotoxic T-lymphocyte-associated antigen 4 (CTLA-4) antibody, interleukin (IL)-2, IL-6, IL-12, interferon-alpha (IFN-α), IFN-β, IFN-γ, granulocyte-macrophage colony-stimulating factor (GM-CSF), granulocyte colony-stimulating factor (G-CSF), and cancer vaccine (e.g., human papillomavirus (HPV) vaccine, and hepatitis B vaccine).

Another aspect of the present disclosure is directed to a method of characterizing particles in an airborne sample, for example, determining the mass distribution of the particles in the airborne sample. The method comprises, (a) determining the mass to charge (m/z) ratio and the charge (z) of each of the particles by use of the present device;

(b) calculating the mass of each of the particles based on the result of the step (a); and (c) characterizing the particles in the airborne sample based on the calculated mass in step (b).

The steps of the present method are similar to those aforementioned, and hence, detailed description thereof is omitted herein for the sake of brevity.

According to some embodiments of the present disclosure, in the step (c), the mass distribution of the particles in the airborne sample is determined based on the mass calculated in the step (b). Then, the level of particles having a specific mass or a size corresponding to the mass (e.g., $PM_{10}$ or $PM_{2.5}$ particles) in the airborne sample may be determined based on the mass distribution. Thus, a skilled artisan may monitor the quality of the airborne sample via analyzing the level of the specific particles (e.g., $PM_{10}$ or $PM_{2.5}$ particles) in the airborne sample, and take a suitable action with respect to the airborne sample in time.

The particles are preferably microsized particles; in other words, each of the particles has a diameter less than 1,000 μm, for example, a diameter of 0.1, 0.2, 0.3, 0.4, 0.5, 0.6, 0.7, 0.8, 0.9, 1, 2, 3, 4, 5, 6, 7, 8, 9, 10, 20, 30, 40, 50, 60, 70, 80, 90, 100, 150, 200, 250, 300, 350, 400, 450, 500, 550, 600, 650, 700, 750, 800, 850, 900, 950 or 1000 μm. According to some embodiments of the present disclosure, the average diameter of the particles is less than 10 micrometers, e.g., $PM_{10}$ particles. According to alternative embodiments of the present disclosure, the average diameter of the particles is less than 2.5 micrometers, e.g., $PM_{2.5}$ particles.

The following Examples are provided to elucidate certain aspects of the present invention and to aid those of skilled in the art in practicing this invention. These Examples are in no way to be considered to limit the scope of the invention in any manner. Without further elaboration, it is believed that one skilled in the art can, based on the description herein, utilize the present invention to its fullest extent. All publications cited herein are hereby incorporated by reference in their entirety.

Example

Materials and Methods

ESI QIT MS

In structure, the present device had an ESI source for ionization. The ESI source comprised a silica capillary with an ID of 150 μm, an OD of 360 μm and a high voltage connector. A 3.0-kV DC was applied to the needle with the cone grounded during the spray process. The entrance was built in a cone shape, and a 0.5 mm ID stainless steel (SS) capillary was inserted inside the cone. Capillary heating did not have a positive effect on the ionization of cell particles and did not change the instrument sensitivity. Since cancer cell membrane is in general fragile; the SS capillary was not heated during the spray process. After passing through the entrance capillary, the ESI-generated particles reached the first desolvation region, and the capillary ended with a skimmer. The hole size of the skimmer was 0.5 mm. After the skimmer, the particles entered the second desolvation region. There was a quadrupole ion guide after the skimmer. The lengths of the quadrupole ion guide were 12 cm, and there was an entrance lens with a hole of 0.75 mm right after the quadrupole ion guide. The pressure inside the MS was maintained only by a mechanical pump, and no advanced pump (e.g., turbo pump, diffusion pump, cryogenic pump, and/or anion pump) was used. The orientation of the MS was perpendicular to the floor to reduce the effect by gravitational. When the particles were sprayed into the MS, they traveled straight into the quadrupole ion guide. The samples may be introduced in either solid or liquid form. The sensitivity should reach a single cell for any cell trapped in the ion trap.

The ion trap had a hyperbolic surface, in which the effective length ($2z_0$) was about 14.14 mm and the effective radius ($r_0$) was about 5 mm. Two identical end-caps were separated by two polytetrafluoroethylene (30×10 mm) insulators from the center electrode. Four holes were on the ring electrode: two for the laser light and another two for the observation of light scattering from the trapped particles. The sample was introduced from the upper electrode and ejected to both sides, and detected by a charge detector placed right under the ion trap. The RF trapping voltage was provided by a function generator, amplified by a power amplifier.

Sample Preparation

Polystyrene microparticles of different sizes (3-20 μm) were used for instrument calibration. To remove the impurities from microparticles, the polystyrene particles were washed with deionized water several times and then recovered via centrifugation. The particles were subsequently re-suspended in a 70% ethyl alcohol solution.

Different sizes of breast cancer cells of the same type were used. The cells were cultured at 37° C. under a 5% $CO_2$ atmosphere in RPMI 1640 medium containing 2 mM L-glutamine, 10% fetal calf serum and 1% penicillin/streptomycin (10,000 IU/mL). After growing enough cells, they were detached from the surface of the Petri dish using the enzyme, trypsin. After harvesting the cells, they were washed three times and suspended in PBS buffer. The cell membranes were fixed with 4% formaldehyde in PBS for 15 minutes at room temperature. The cells were centrifuged and then washed three times with deionized water. In the final step, the cells were re-suspended in a 70% ethanol solution at a concentration of about $1\times10^7$ cells/mL.

Detection of $PM_{10}$ and $PM_{2.5}$ Particles

Airborne particles such as $PM_{10}$ or $PM_{2.5}$ were collected from air were used. The particles were transferred to the present device by a cotton swab. The particles transferred into present device were trapped in constant voltage and frequency. Airborne particles trapped in the ion trap were detected by stepping increase the high frequency from 50 hz to 30000 hz then gradually ejected to 1 hz. Particles with high to low mass were be detected respectively.

Example 1 Characterization of Cytochrome c and High-Mass Particles

Figure 5:
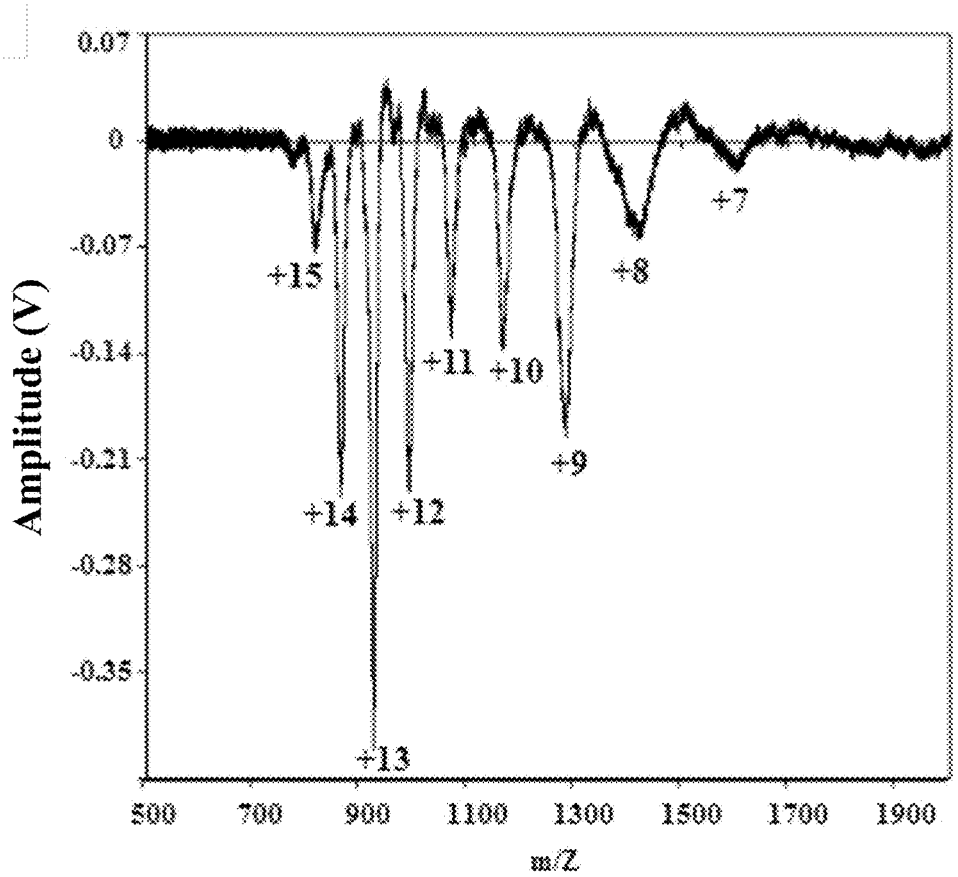
FIG. 5 is the ESI MS spectrum of cytochrome c according to one embodiment of the present disclosure, in which the data were collected by using a charge detector, and the concentration of the cytochrome c solution was $1\times10^{-6}$ M.
Figure 6A:
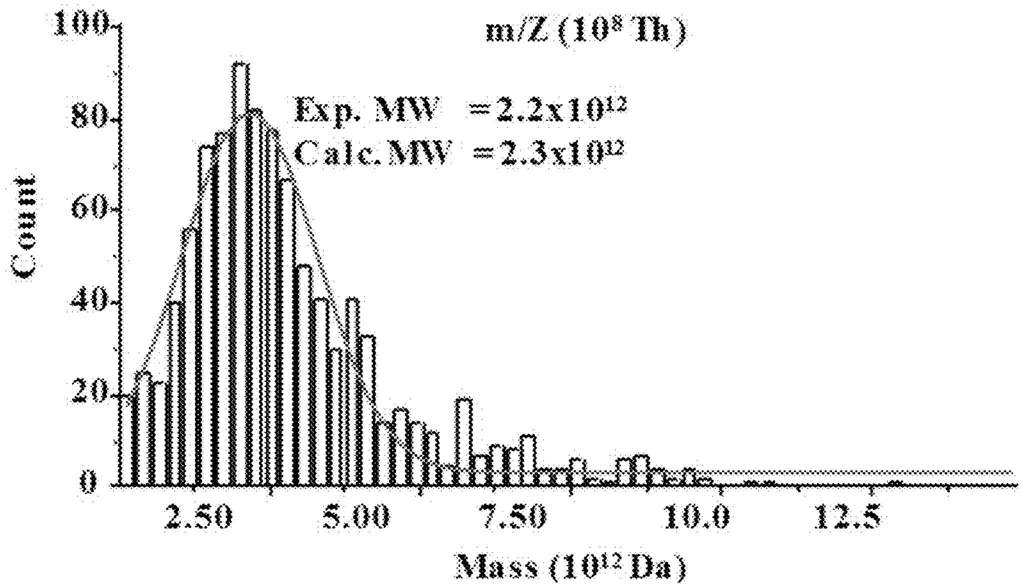
FIGS. 6A-6F respectively depict the mass distributions of polystyrene (PS) particles with sizes of 2 μm (FIG. 6A), 4 μm (FIG. 6B), 6 μm (FIG. 6C), 9 μm (FIG. 6D), 11 μm (FIG. 6E), and 15 μm (FIG. 6F) according to another embodiment of the present disclosure. Solid lines indicated the curve fitting for the histogram.
Figure 6B:
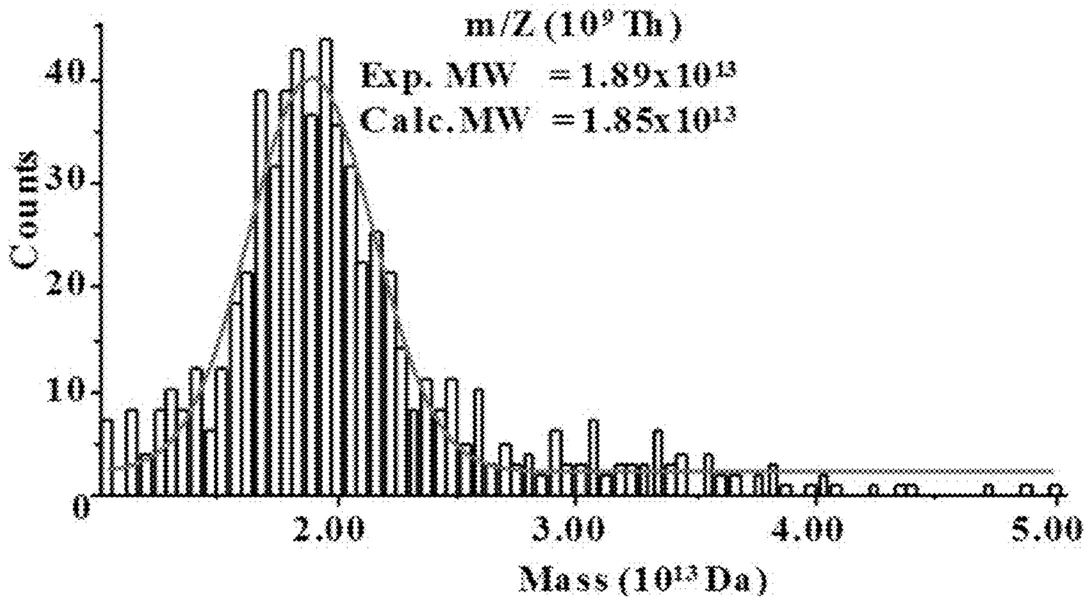
Figure 6C:
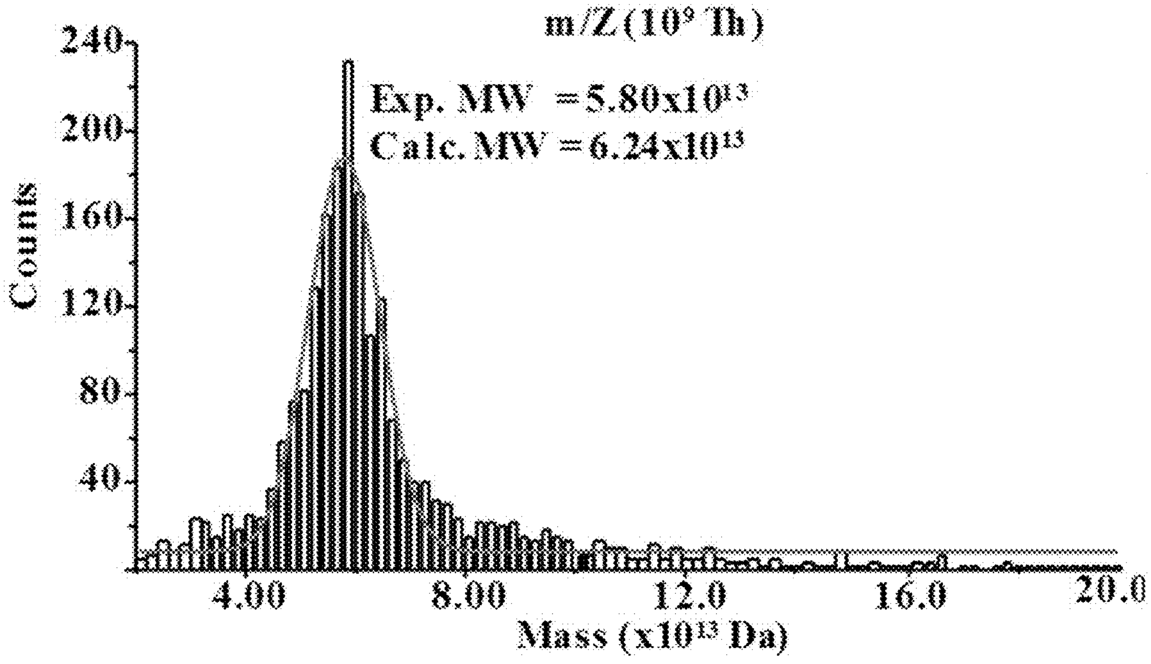
Figure 6D:
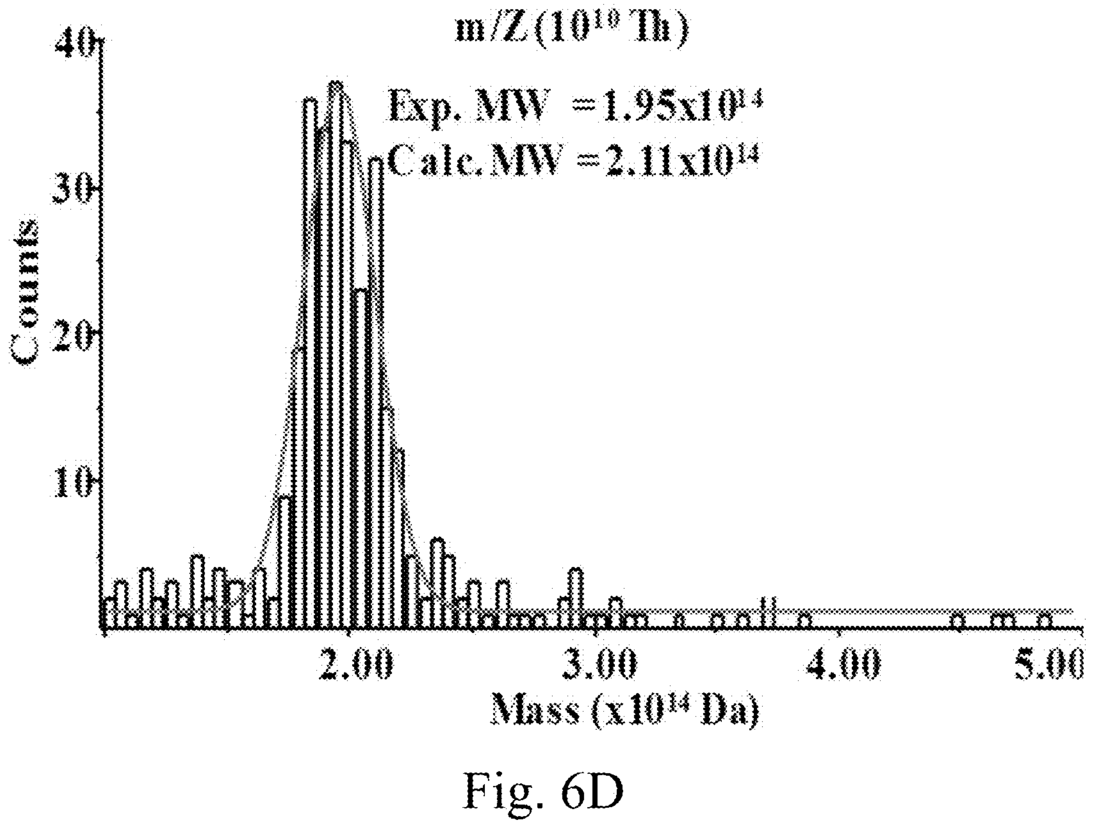
Figure 6E:
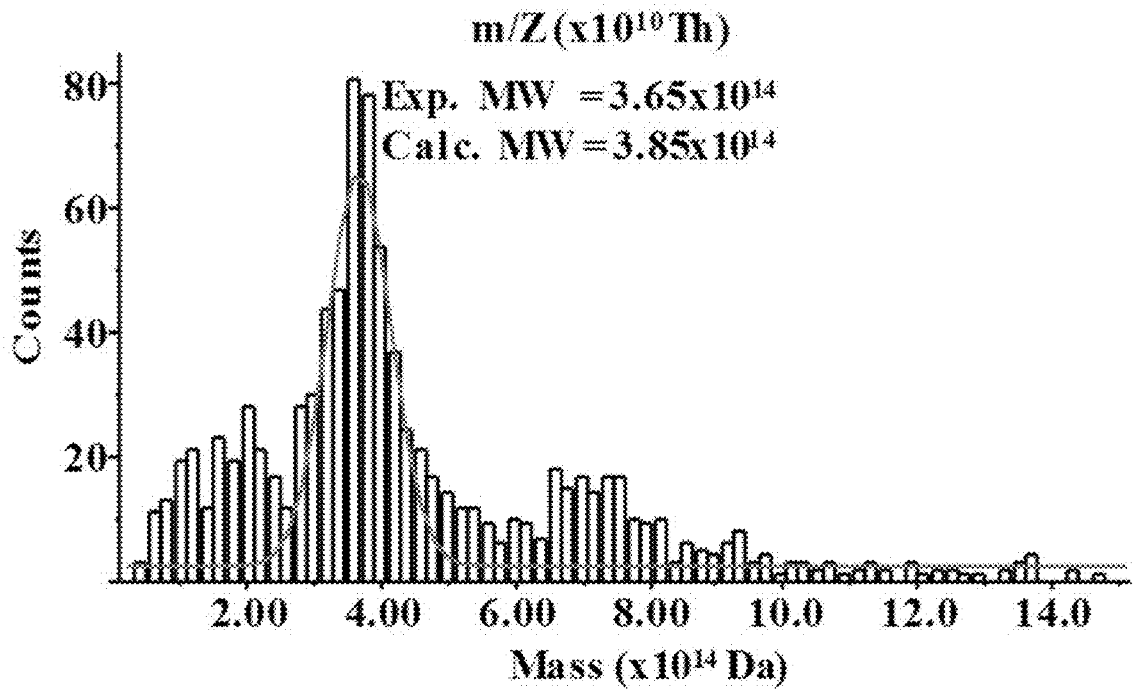
Figure 6F:
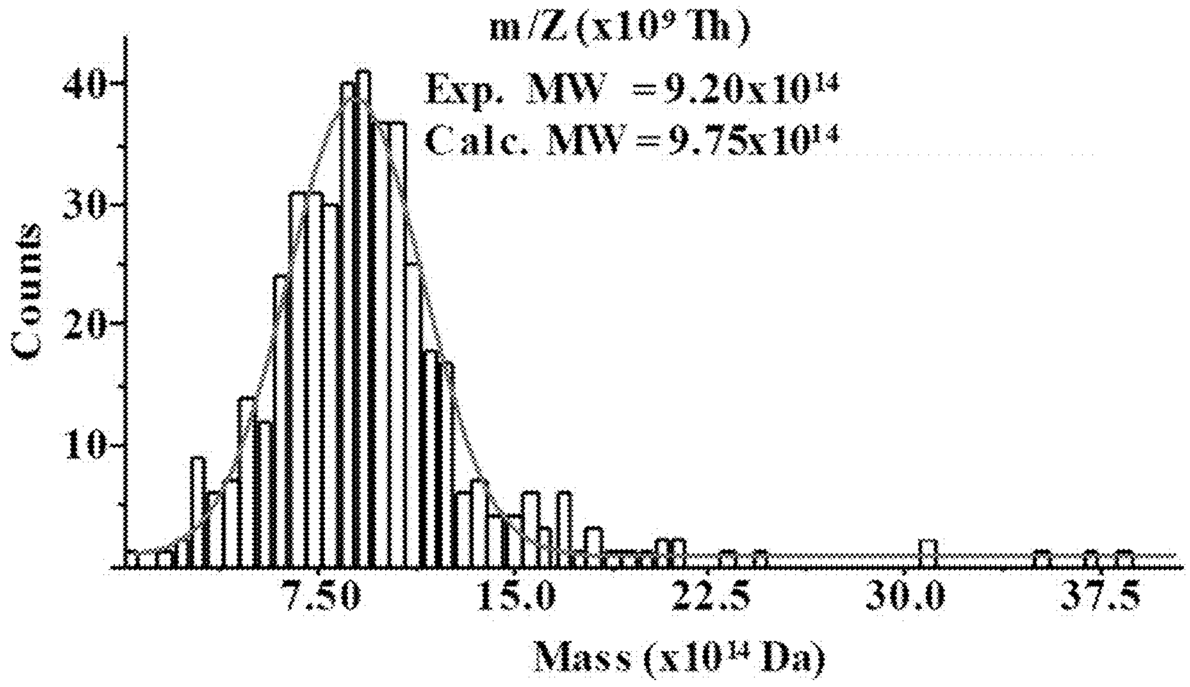

The present device was assessed using a protein to elucidate its probability of acting as a charge-monitoring MS. All key parameters were adjusted for cytochrome c molecules. For signal detection, a homemade power amplifier was used to apply a 250-kHz AC with the amplitude adjustable to 600 Vp-p. The device was pumped down using three rough pumps, and no advanced pump (e.g., turbo pump, diffusion pump, cryogenic pump, and/or anion pump) or buffer gas was used. The pressure was adjusted to the 20-mTorr region by adjusting the pump valves. A standard mass-selective instability mode was used to select the ions of interest. The frequency was scanned to determine the m/z values of the particles. Before the collection of mass spectra, the charge detector was calibrated by using a one-millivolt test voltage and measuring the resulting signal to calculate the charge number for each millivolt. The electronic noise was less than 250 electrons. The cytochrome c ESI-MS spectrum was depicted in FIG. 5. To improve the resolving power, the scan time was decreased to 0.5 ms, and the collected spectrum was averaged 10 times. The collected spectra accurately reflected the cytochrome c spectra with a reasonable resolving power ($m/\Delta m=100$ at $m/Z=900$).

Example 2 Characterization of Polystyrene (PS) Particles

The ESI spray of the present device was oriented right above the interface cone in the perpendicular position. The syringe pump was also placed in the perpendicular position to provide a smooth flow into the ESI spray. Typical mass distributions of different polystyrene (PS) particles were depicted in FIGS. 6A-6F. The amplitude of the peak related to the charge number of particles helps to obtain the particle mass. Most mass spectrometers measure the m/z of particles; however, the charge (z) is not measured directly in most cases. As we could measure the charge number of a particle, the mass of that particle was calculated. The width of the mass distribution represents the synthesis purity of particles of the same size. The number of peaks depends on the number of trapped particles.

The ESI interface plays an important role. Critical parameters include the flow rate, applied potential, gas flow and orientations of injector and syringe pump. The primary concern was the gravitational force. Heavy particles easily precipitated in the syringe or the capillary. Therefore, all parts of ESI spray were in a perpendicular position. The clogging became severe for larger particles. Moreover, the flow rate should not be too low. Thus, the best way was to use a lower concentration and higher flow rates. The flow rates were mostly set at 10 μl/min. The range was between 5 and 12 μl/min. In all experiments, no gas flow was used. Apparently, applying gas pressure increased the kinetic energy of the particles, and most of the particles just passed through the trap. For cell experiments, the situations were different; cells had a soft outer tissue, and a higher kinetic energy forced the cells to collide with the chamber walls. Another issue during the spray process was particle desolvation. Application of a high gas flow did not provide enough time for desolvation of the particles before the trap.

The applied voltage was another important parameter. The applied ESI voltage should be selected carefully.

Although the number of trapped particles was low, the solid particles could be trapped without the application of a voltage; a gas flow alone would be enough for trapping. This situation was also true for apolar particles that repelled the apolar solvent molecules around them. The cells had both a polar and an apolar outer layer. Although the range of applied ESI voltage could be changed from 1,000 to 5,000 V for the cancer cells, there was a 3,000-V DC potential applied throughout the experiments.

Figure 7A:
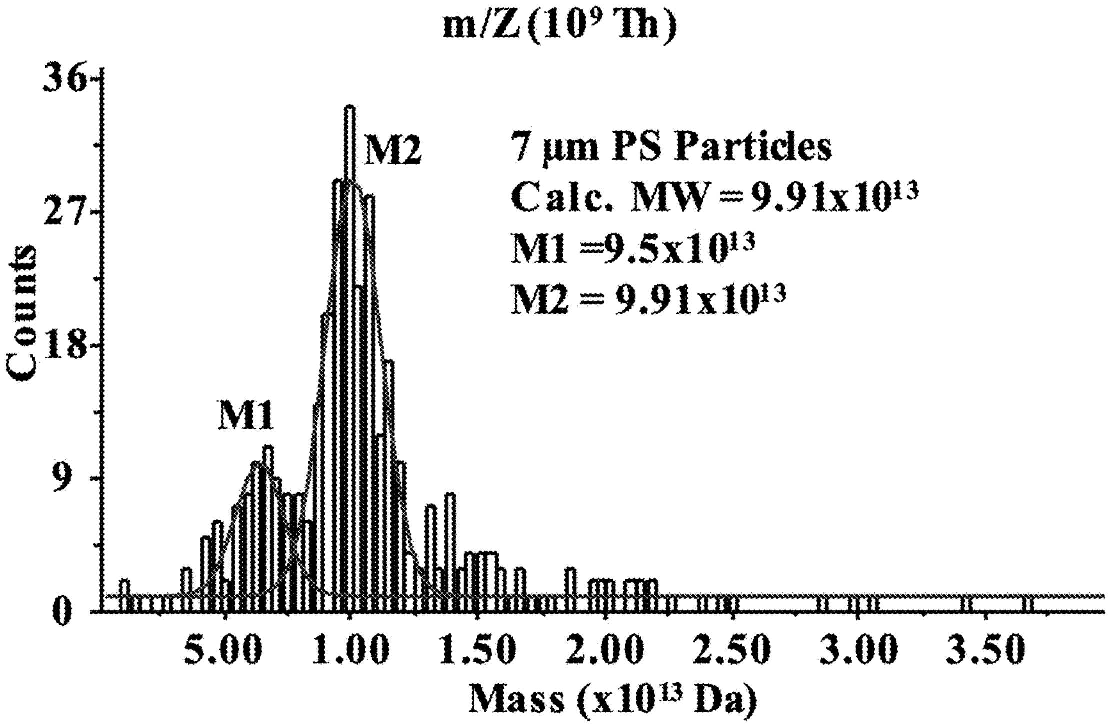
FIGS. 7A-7D are the data of PS particles and red blood cells (RBCs) according to one embodiment of the present disclosure.
Figure 7B:
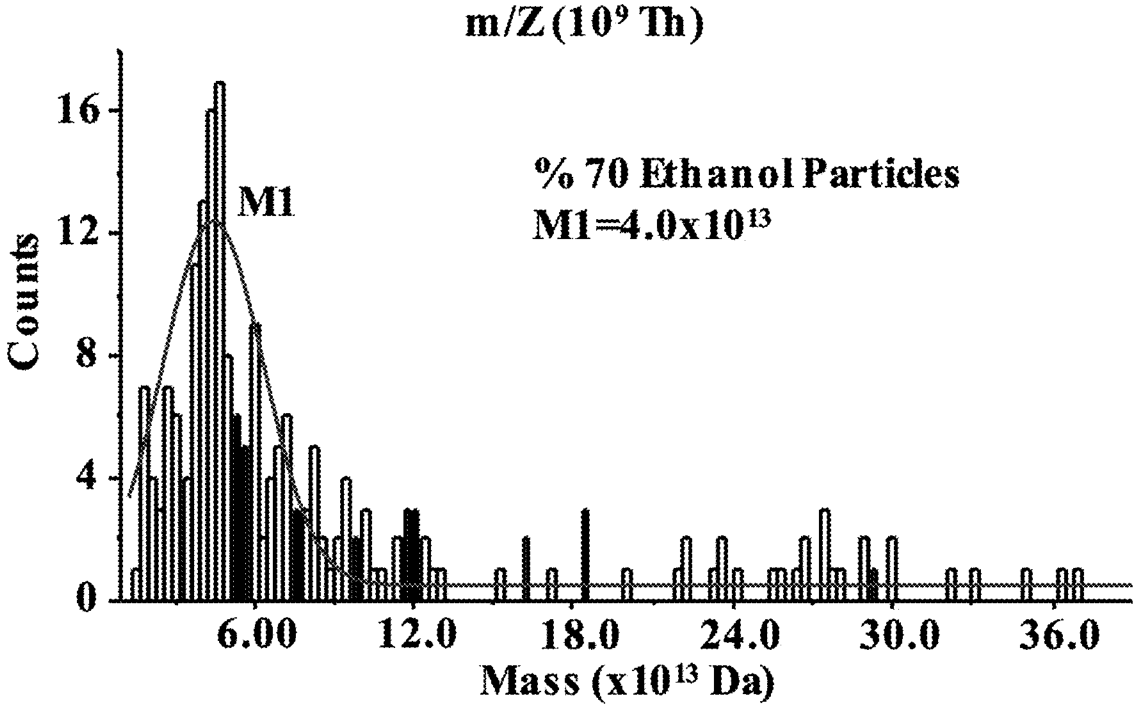
Figure 7C:
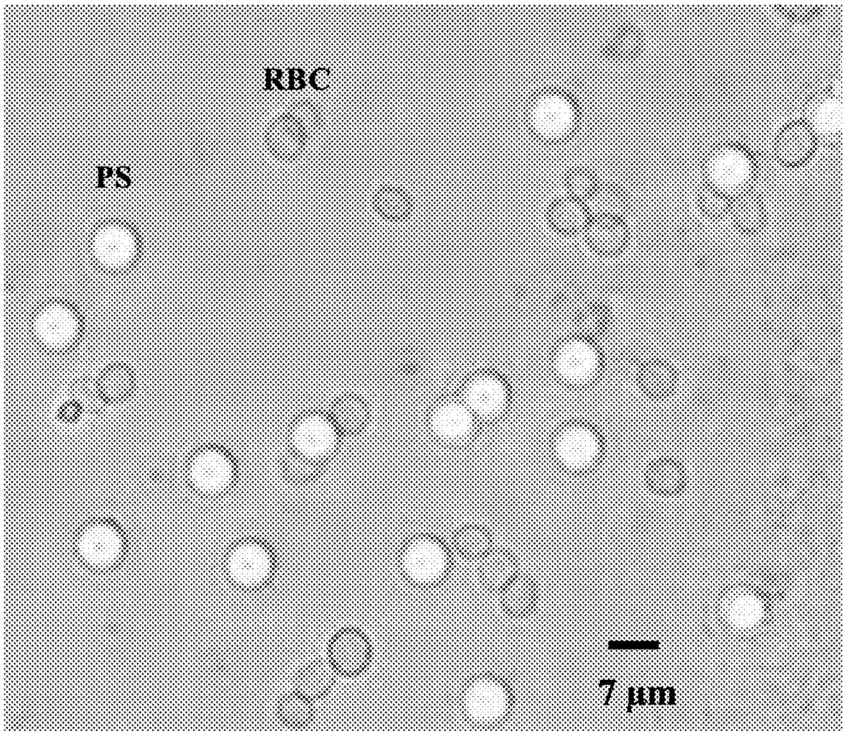
Figure 7D:
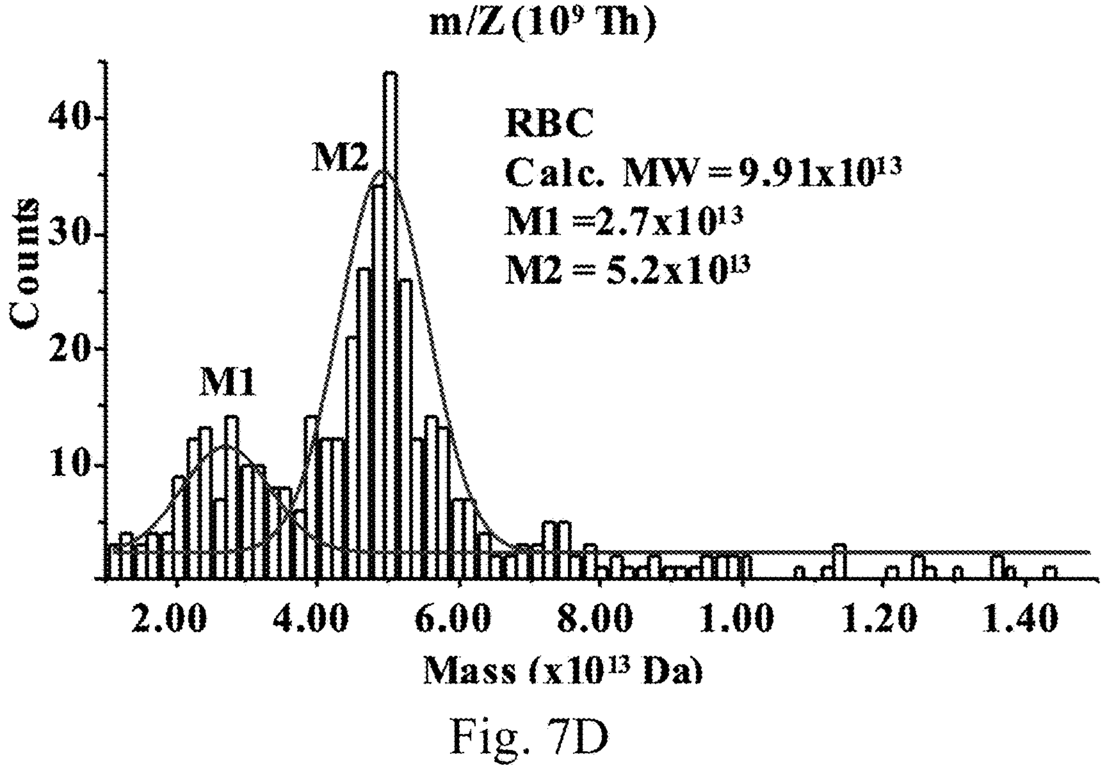

For instrument calibration, 6 different PS particles were used, and the mass distributions of these PS particles respectively having a diameter of 2, 4, 6, 9, 11 and 15 μm were depicted in FIGS. 6A-6F. All of the calibration solutions and final cell solutions were prepared under the same conditions to avoid any effect on mass calibrations. The number of trapped particles gradually decreased as the particle size increased. For each particle size, the mass was measured by averaging several measurements. The trapping efficiency of small particles was very high, and more than one hundred particles were trapped each time; however, this number decreased as the particle size increased. The mass distribution of the particles could be obtained using m/z and the particle charge number. The calculated average masses shown in Table 1 corroborated the theoretical calculations for different particles.

the mass measurements of the RBC, the cell membrane was fixed using formaldehyde. The mixture of the 7-μm PS and fixed RBC were depicted in FIG. 7C. The mass distribution of the RBC was depicted in FIG. 7D. The mass of the solvent particles ($4.0\times10^{13}$ Da) almost overlapped with the RBC mass ($5.2\times10^{13}$ Da) (FIGS. 7B and 7D). Although the mass of the solvent particles was close to the cell mass, as depicted in FIGS. 7B and 7D, the numbers of the solvent particles and RBCs were very different. Therefore, it is not difficult to distinguish the RBC particles from the solvent particles. The number of cells in the solution was an important parameter. If the concentration of particles was not sufficient inside the solution, it would be difficult to distinguish the solvent particles from the sample particles.

Example 4 Characterization of Cancer Cells

The most significant challenge for cell MS is the size of the cells. The bigger the size, the lower the number of particles that can be trapped. For cancer cell studies, different sizes of MCF-7 cancer cells were used. Before the measurements, all cancer cells were treated the same way, and in the final step, they were suspended in an ethanol/water (70/30) solvent mixture. If cancer cells were immersed directly in a 70% ethanol solution, they would explode, and

TABLE 1

Different sizes of PS particles and information of MCF-7 cancer cell molar mass

| Particles | Theoretical MW (Da) | Experimental MW (Da) | Area* | Center* | Width* | W Error* |
|---|---|---|---|---|---|---|
| 2 | 2.30E+12 | 2.17E+12 | 2.18E+14 | 2.18E+12 | 2.22E+12 | 9.53E+10 |
| 4 | 1.85E+13 | 1.89E+13 | 2.41E+14 | 1.89E+13 | 5.21E+12 | 9.94E+10 |
| 6 | 6.24E+13 | 5.80E+13 | 2.88E+15 | 5.80E+13 | 1.27E+13 | 2.14E+11 |
| 7 | 9.91E+13 | 6.37E+13 | 2.15E+14 | 6.37E+13 | 1.88E+13 | 1.65E+12 |
| 9 | 2.11E+14 | 1.95E+14 | 1.33E+15 | 1.96E+14 | 2.96E+13 | 5.95E+11 |
| 11 | 3.85E+14 | 3.65E+14 | 7.65E+15 | 3.66E+14 | 9.54E+13 | 3.65E+12 |
| 15 | 9.75E+14 | 9.20E+14 | 2.47E+16 | 8.86E+14 | 5.15E+14 | 7.43E+12 |
| Blood Cell | — | 5.20E+13 | 1.65E+12 | 1.65E+12 | 1.65E+12 | 1.65E+12 |
| MCF-7 14.1 | — | 2-6 E+14 | 4.95E+15 | 5.85E+14 | 1.70E+14 | 2.06E+13 |
| MCF-7 13.1 | — | 4.50E+14 | 1.08E+15 | 4.50E+14 | 3.50E+14 | 2.50E+13 |
| MCF-7 11 | — | 1-3.6E+14 | 1.70E+15 | 3.44E+14 | 6.37E+13 | 5.07E+12 |

*Area refers to the area under the fitting curve.
*Center refers to the center point of the fitted curve (red line).
*Width is the width of fitted curve.
*W Error is the width calculation error.

Example 3 Analysis of Red Blood Cells (RBCs)

The most significant challenge in performing ESI QIT MS of particles comes from the solvent particles that are formed during the evaporation process. A fast solvent evaporation harvests a significant amount of energy from the droplets, and the droplets freeze before complete evaporation. This process creates charged particles, which may interfere with the mass spectra. Solvent particle interference is dominant in the small m/z region; however, in the higher mass region, there is almost no solvent effect. Therefore, it is important to primarily use low-polarity organic solvents to avoid the formation of larger solvent particles. The mass distribution of PS particles were depicted in FIG. 7A. PS particles were not very pure and gave two peaks due to the impurity present in the solution. The mass distribution of 70% ethanol solution serving as the control group was depicted in FIG. 7B.

RBCs are the first choice for testing the newly designed ESI QIT MS. The sizes of the RBCs were approximately 6 μm; however, they did not have a spherical structure. Before no intact cell would remain in solution. Instead of directly immersing the cells in 70% ethanol solution, the cells were transferred into a 3.7% formaldehyde solution to crosslink the cell walls. After washing and checking the cells under a microscope, the cells were transferred into a 70% ethanol solution. The related mass region was calibrated using standard PS particles from 11 μm to 15 μm that were treated with and suspended in the same agents.

Figure 8A:
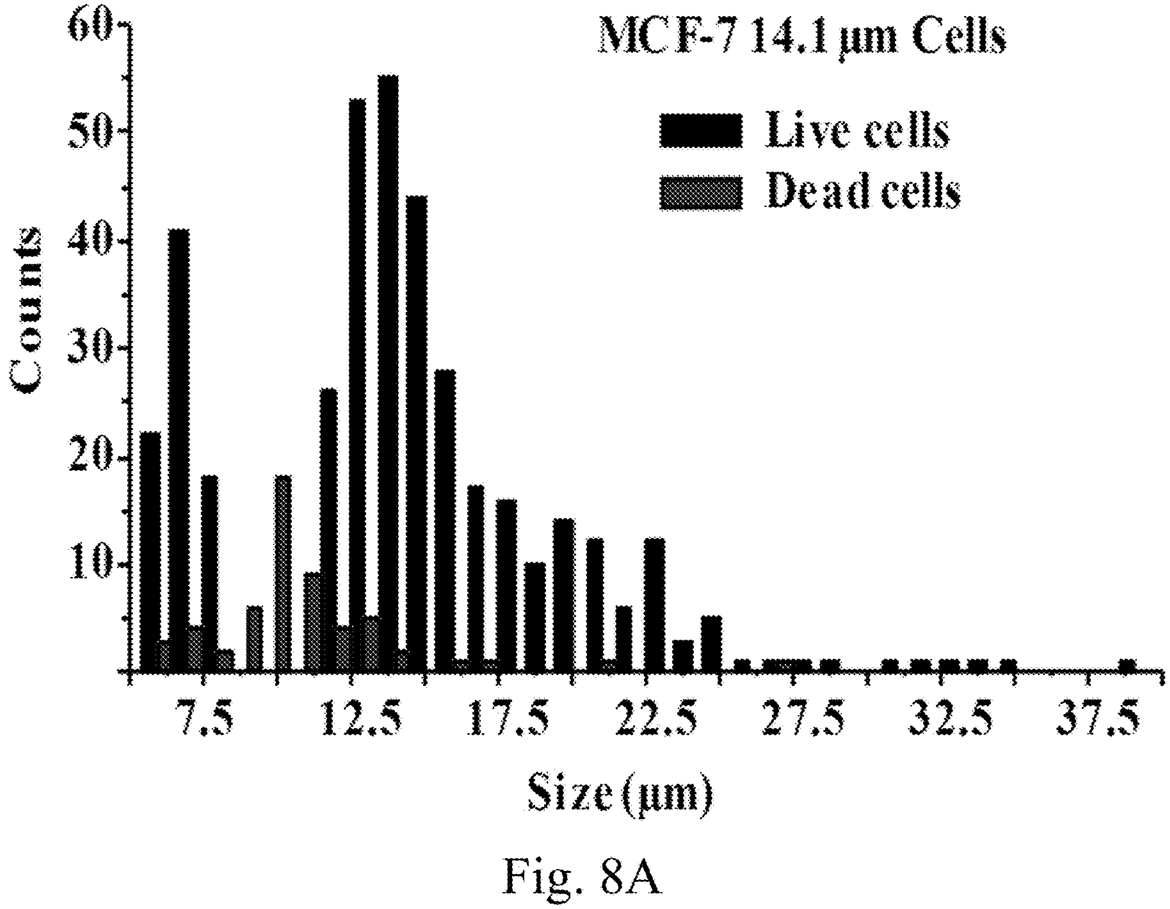
FIGS. 8A-8D are the data of MCF-7 cancer cells according to another embodiment of the present disclosure.
Figure 8B:
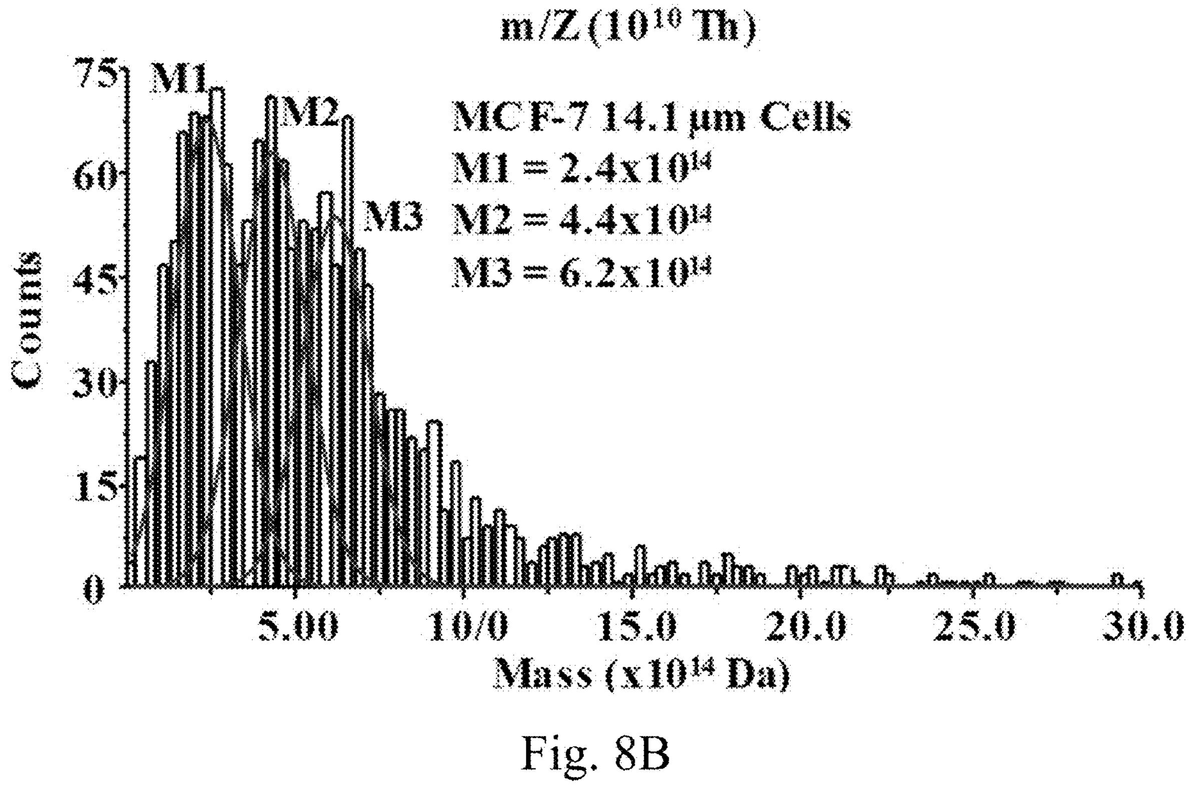

The mass distribution of the MCF-7 cells exhibited a large variation. The microscope image of the suspended MCF-7 cells incubated in the culture medium was detected (data not shown), in which the size variation can be easily seen. The size distribution for the same cells was depicted in FIG. 8A. If all cells were assumed to be uniform in size, and the average size of the cells was 14.1 μm, then the masses of the cells should be close to the mass of the 15-μm PS particles. Three different MCF-7 cancer cell were analyzed in this study. FIG. 8B depicts the mass distribution of MCF-7 cancer cells, which had an average diameter of 14.1 μm, and were fixed and suspended with 15-μm PS particles. The histogram spectrum showed the mass distribution of cancer cells from $1.0\times10^{14}$ to $15.0\times10^{14}$ Da. The histogram had three fitted peak regions or three different mass regions. If all cells were assumed to have the same size, the histogram spectrum should be similar to the histogram of the 15-μm PS particles. Most particles were populated in the 2-$6\times10^{14}$ Da mass region, which corresponded to a size of 9 to 13 μm for the cells. It is possible that not all of the larger cancer cells survive during the spray process.

Figure 8C:
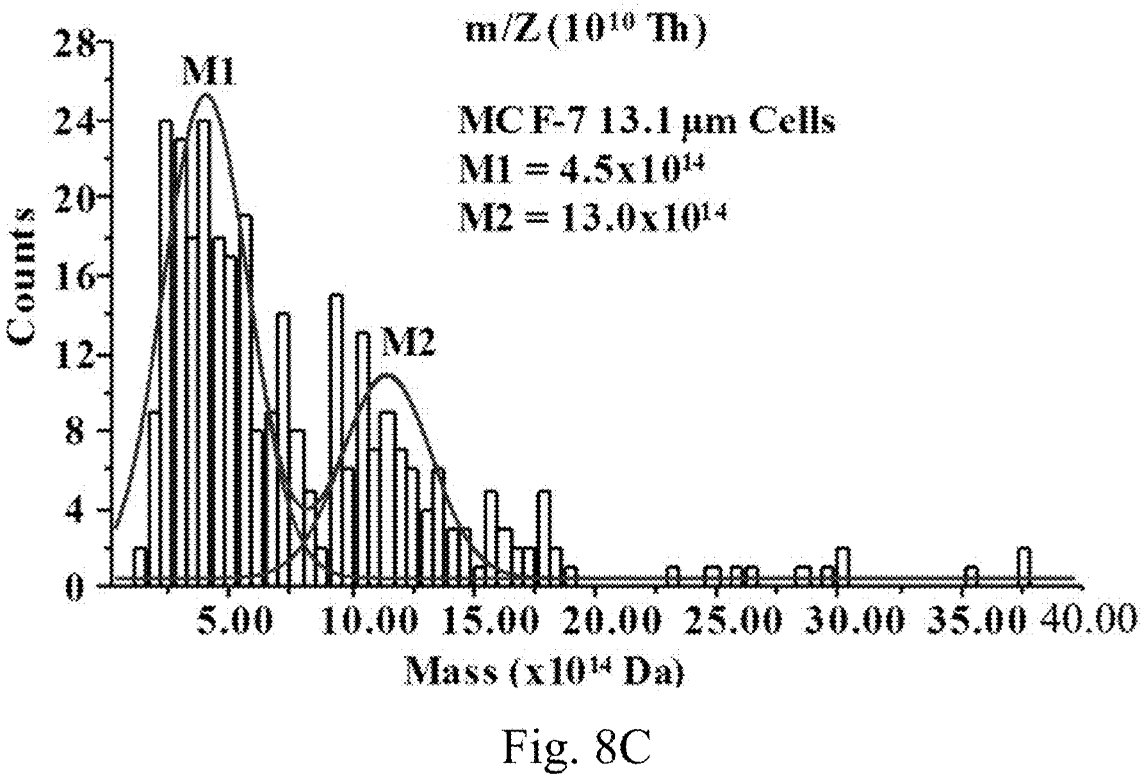

FIG. 8C shows the mass distribution of MCF-7 cancer cells having an average diameter of 13.1 μm. By using the size of cells, the calculated average mass of cells should be approximately $6\times10^{14}$ Da. The mass peak was approximately $4.5\times10^{14}$ Da, and in the higher mass region, another small population arose, which may be due to dimers and trimers of cells.

Figure 8D:
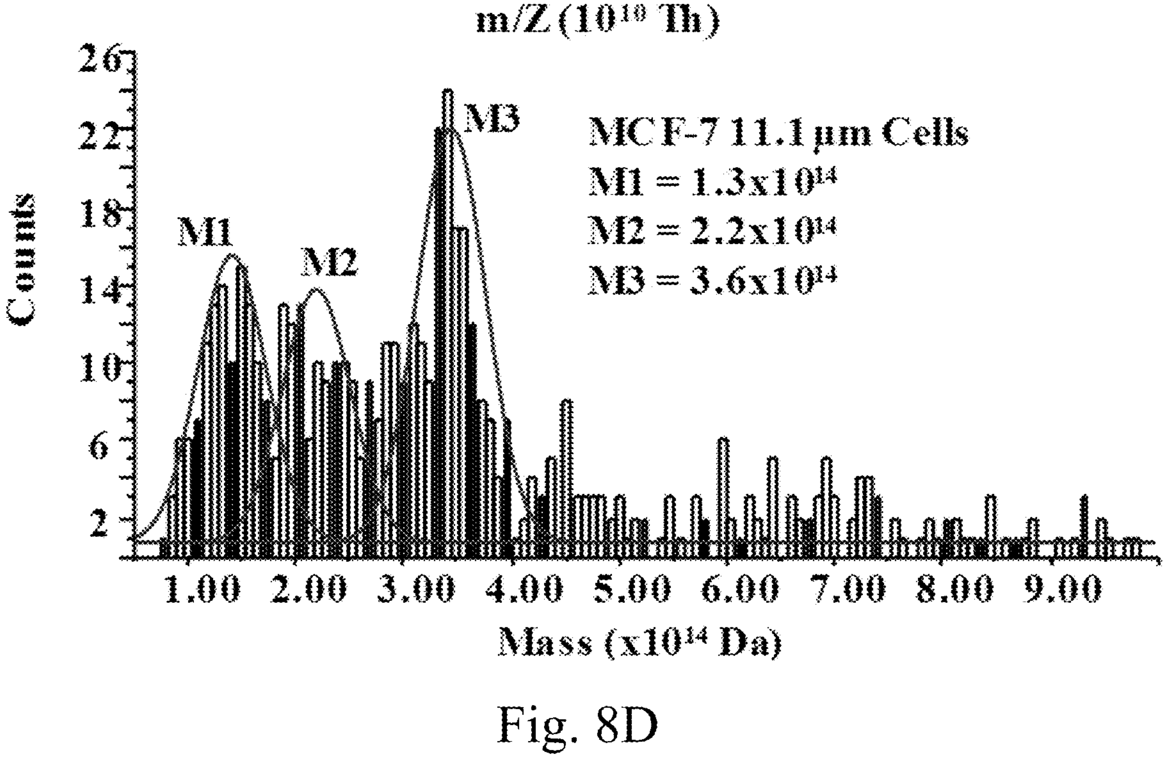

Similarly, the mass distribution of MCF-7 cancer cells having an average diameter of 11.1 μm was taken and depicted in FIG. 8D. The theoretical mass should give approximately $3.85\times10^{14}$ Da. The experimental results indicated that the particles were distributed between 1 and $4\times10^{14}$ Da, which represented the MCF-7 cells having 11.1 μm in diameter. The mass shift from the theoretical calculations is most likely due to the cell membrane fixing process. During this process, all conditions should be adjusted very carefully to protect the osmotic pressure and keep it equal both inside and outside of the cell. Any difference will cause the cell to shrink or explode. During the cell wall crosslinking with formaldehyde, the process should be continuously monitored under the microscope. Otherwise, most cells can aggregate and form larger clusters.

All m/z values and related charge numbers of the cells can reveal the approximate mass of the particles. A comparison of the charge number of PS particles reveals an approximate linear relationship between the mass and charge number of the particles. Similarly, the cell particles carry the same amount of charge depending on their size. The mass calculation requires the charge number of the available particles. There is an important static electricity property that should be considered regarding the charge of the particles. Static electricity is a localized charge, and it is not certain that the charge distribution is even on the surface of particles.

The mass distribution of all of the PS particles and MCF-7 cells was summarized in Table 1. The particle mass distribution of the PS particles should exhibit a narrow mass distribution depending on the uniformity of the particles. Although the mass of the particles is uniform, they may form dimers, trimers or larger clusters. For small particles, this is important for distinguishing the particle clusters due to the small mass shift and low resolving power; however, for larger masses, multiple particle clusters can be distinguished easily because of the large mass shift. For cell mass spectrometry, the particles exhibit a larger mass distribution due to the lack of uniformity. This should be analyzed very carefully to understand the mass spectra of particles.

As shown above, although cancer cells have a very broad mass distribution because of their continuous growth until division and the formation of smaller cells after division, RBCs show narrow distributions. The present ESI QIT MS built for cell measurements is a more practical tool to reduce the analysis time to determine red blood cell distributions associated with the diseases compared with LIAD measurements performed in the past or microscope examination. Since RBC is not even spherical (dish shape), it is more difficult to estimate the size. When many red blood cells need to be analyzed by microscope, it is very time-consuming. It is well known that cancer cells sometimes have both small and giant cells. The percentage of larger cells is related to the cancer prognosis. The present device can be used to distinguish among different types of cancer cells. Quantitative estimation of the cell size can also be obtained. The distinction of cancer cells versus normal cells relies on cancer biomarkers. A typical approach is an antibody which is specific to a special kind of cancer cell to attach onto a magnetic nanoparticle so that these specific cancer cells can be pulled out by a magnetic field. For example, circulating tumor cells (CTC) are often pulled out by anti-EpCAM-functionalized (EpCAM: epithelial cancer marker) supported lipid bilayer. The present invention can be used to measure the mass distribution of cancer cells after they are pulled out from the biomarkers. The percentage of cancer cells compared to the total cells can also be estimated. If giant cells are observed in the removed tissue of a brain tumor, the possibility of this brain tumor is malignant is high.

Example 5 Diagnosis of Cancers

For the purpose of making a diagnosis of cancers, the test tissue isolated from a subject suspected of having cancers was minced or cut into small species. After washing with PBS for three times, the small species were digested by trypsin followed by incubating at 30° C. for 90 minutes. The cells re-suspended in PBS were filtered by fine mesh and washed with PBS for three times. After fixing with formaldehyde solution for 10-20 minutes, the cells were re-suspended in ethanol/water (70/30) solution and subjected to the present device to measure the mass distribution thereof.

When the test tissue exhibits different mass distribution in mass spectrum from that of the control tissue (i.e., the tissue isolated from a healthy subject), then the subject may have cancers.

Example 6 Measurement of Airborne Microparticles

Figure 9A:
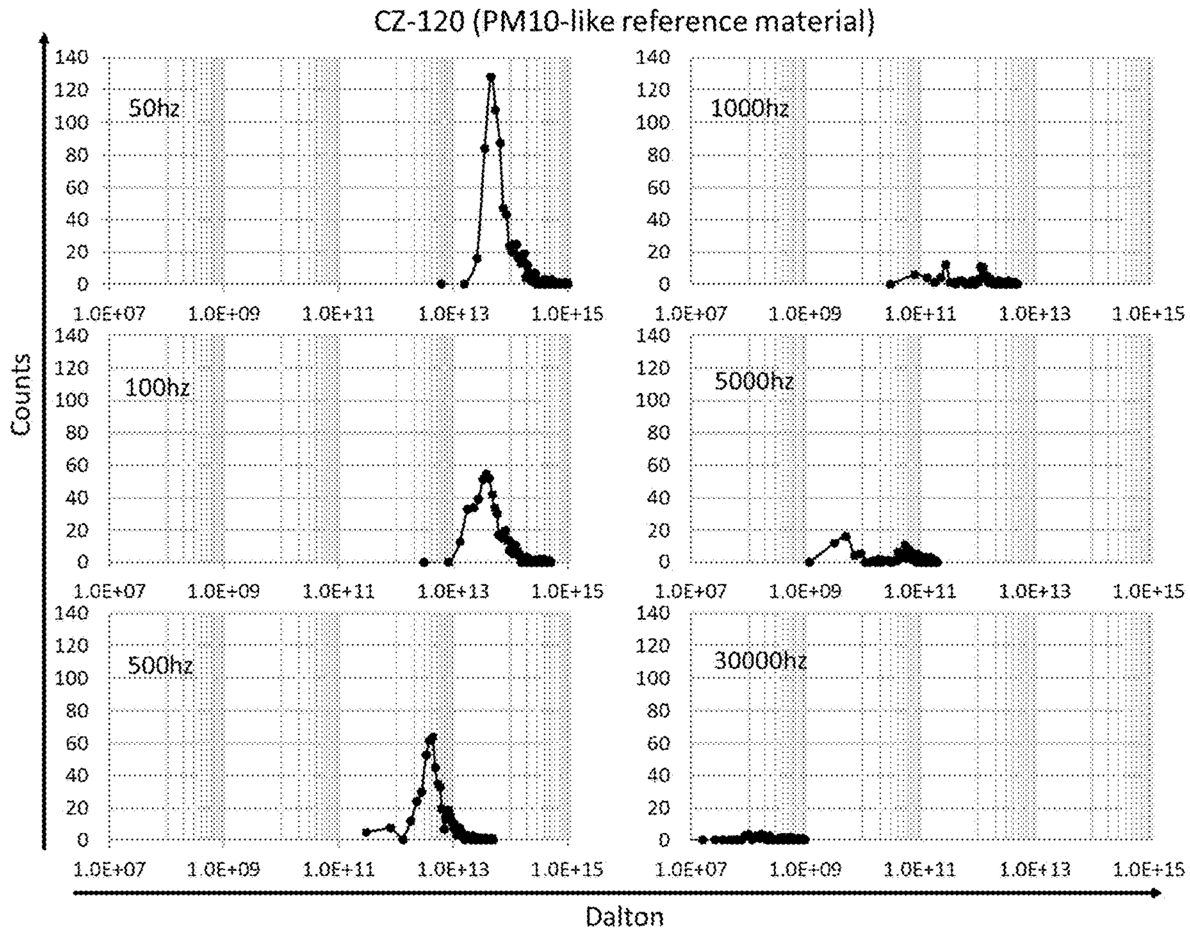
FIGS. 9A and 9B are the mass distributions of micronized particles in an airborne sample according to still another embodiment of the present disclosure, in which the micronized particles $PM_{10}$ (FIG. 9A) and $PM_{2.5}$ (FIG. 9B) were respectively detected by the present device using specified scanning frequency.
Figure 9B:
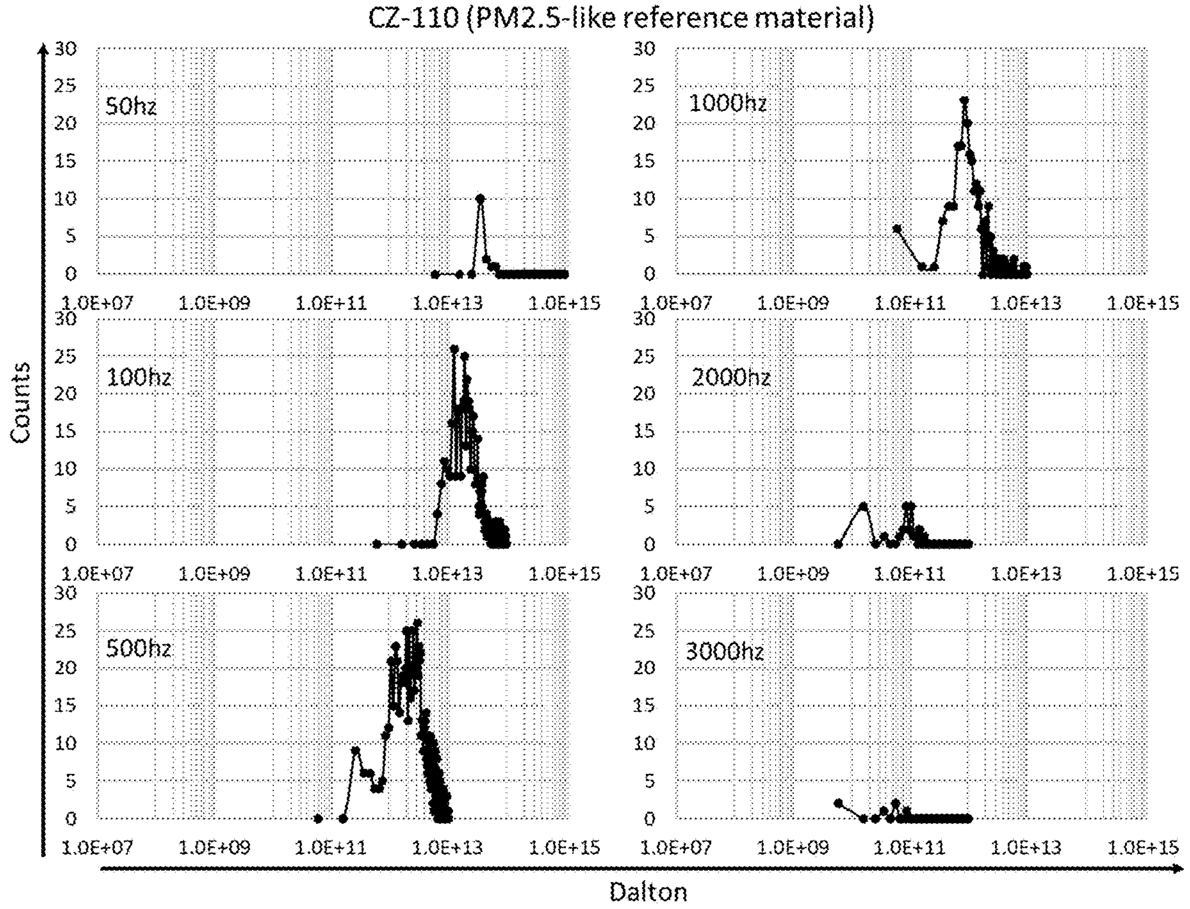

The airborne sample including $PM_{10}$ or $PM_{2.5}$ aerosol particles was subjected to the present device thereby measuring the mass distribution of the aerosol particles in the airborne sample. The quadrupole ion guide of the present device provided a radiofrequency field for guiding ions through the ion guide. As the data of FIGS. 9A and 9B depicted, the $PM_{10}$ (FIG. 9A) and $PM_{2.5}$ (FIG. 9B) aerosol particles could be detected by the present device under different radiofrequency fields, and the mass distribution of charged particles was correlated with the size distribution thereof.

In sum, the present disclosure provides an ESI-QIT-MS useful in rapid mass analysis of large particles and cells in their native environment. This new device does not require the application of different voltages to the interface lenses. The only voltages applied to the whole device were the DC voltage and RF trapping voltage to the ESI source and ion trap, respectively. No nebulizing gas was applied to the spray source. The masses of cancer cells and their mass distributions were measured successfully. In comparison with other laser-based methods, the sample preparation is much simpler and takes less time. This method can easily provide information for the measurement of solution-based particles without drying.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention.

What is claimed is:

1. A device for characterizing a sample, comprising,
(a) an electrospray source configured to ionize the particles in the sample;
(b) a mass analyzer configured to determine the mass to charge (m/z) ratio of each of the ionized particles; and
(c) a charge detector configured to determine the charge (z) of each of the ionized particles;
wherein the mass analyzer comprises a quadrupole ion trap, which comprises,
a central electrode having a first central aperture;
a pair of insulators respectively having a second and a third central apertures, and being disposed above and below the central electrode, respectively; and
a pair of end caps respectively having a fourth and a fifth apertures, and being disposed above and below the pair of insulators, respectively; wherein
the first, second, third, fourth and fifth apertures are coaxially aligned so that the central electrode, the pair of insulators and the pair of end caps form a partially enclosed cavity, which has a radius of about 1-100 mm, and a length of about 1-100 mm.

2. The device of claim 1, wherein each of the central electrode and the pair of end caps is produced by a doped semiconductor material.

3. The device of claim 1, wherein the insulator is made of at least one polymer selected from the group consisting of, polypropylene, polyester, polytetrafluoroethylene, polyethylene, polyurethane, polyacrylate, nylon, propyl adiene monomer, polystyrene, butyl methacrylate, methyl methacrylate, and a combination thereof.

4. The device of claim 1, further comprising an ion guide configured to guide the ionized particles from the electrospray source to the mass analyzer.

5. The device of claim 4, wherein the ion guide is a quadrupole ion guide, and the length of the electrodes of the quadrupole ion guide is about 1-100 cm.

6. The device of claim 5, wherein the length of the electrode of the quadrupole ion guide is about 12 cm.

7. The device of claim 4, further comprising a filter configured to guide the ionized particles from the electrospray source to the ion guide, wherein the filter has an orifice of about 0.05 to 2 mm.

8. The device of claim 7, wherein the orifice of the filter is about 0.5 mm.

9. The device of claim 1, wherein the sample is a biological sample or an airborne sample.

10. The device of claim 1, wherein the device does not comprise a turbo pump, a diffusion pump, an ion pump, or a cryogenic pump.

11. A method of determining the mass distribution of particles in an airborne sample, comprising,
(a) determining the mass to charge (m/z) ratio and the charge (z) of each of the particles by use of the device of claim 1;
(b) calculating the mass of each of the particles based on the result of the step (a); and
(c) determining the mass distribution of the particles in the airborne sample based on the calculated mass in step (b).

12. The method of claim 11, wherein the particles have an average diameter less than 10 micrometers.

13. The method of claim 12, wherein the particles have an average diameter less than 2.5 micrometers.

14. The method of claim 11 wherein the device does not comprise a turbo pump, a diffusion pump, an ion pump, or a cryogenic pump.

15. A method of determining whether a subject has or is at risk of developing a cancer, comprising,
(a) obtaining a biological sample from the subject, wherein the biological sample comprises a plurality of cells;
(b) determining the mass to charge (m/z) ratio and the charge (z) of each of the cells in the biological sample by use of the device of claim 1;
(c) calculating the mass of each of the cells in the biological sample based on the result of the step (b); and
(d) assessing whether the subject has or is at risk of developing the cancer based on the calculated mass in step (c), wherein when the mass distribution of the cells in the biological sample is different from that of a control sample, then the subject has or is at risk of developing the cancer.

16. The method of claim 15, wherein the control sample is derived from a healthy subject.

17. The method of claim 15, wherein the control sample is a synthetic polystyrene particle.

18. The method of claim 15, wherein the biological sample is suspended in 70% ethanol.

19. The method of claim 15, further comprising fixing the biological sample by a fixation buffer prior to the step (b).

20. The method of claim 15, wherein the cancer is selected from the group consisting of gastric cancer, lung cancer, bladder cancer, breast cancer, pancreatic cancer, renal cancer, colorectal cancer, cervical cancer, ovarian cancer, brain tumor, prostate cancer, hepatocellular carcinoma, melanoma, esophageal carcinoma, multiple myeloma, and head and neck squamous cell carcinoma.

21. The method of claim 15, wherein the device does not comprise a turbo pump, a diffusion pump, an ion pump, or a cryogenic pump.

* * * * *